United States Patent
Ueda

(10) Patent No.: US 7,505,307 B2
(45) Date of Patent: Mar. 17, 2009

(54) SEMICONDUCTOR MEMORY HAVING RESISTANCE CHANGE ELEMENT

(75) Inventor: Yoshihiro Ueda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 99 days.

(21) Appl. No.: 11/781,443

(22) Filed: Jul. 23, 2007

(65) Prior Publication Data

US 2008/0043514 A1      Feb. 21, 2008

(30) Foreign Application Priority Data

Aug. 16, 2006 (JP) .............................. 2006-222005

(51) Int. Cl.
  *G11C 11/00* (2006.01)
(52) U.S. Cl. ...................................... 365/158; 365/171
(58) Field of Classification Search ................. 365/158, 365/171, 173
See application file for complete search history.

(56) References Cited

U.S. PATENT DOCUMENTS

| 5,695,864 | A | 12/1997 | Slonczewski |
| 5,706,228 | A | 1/1998 | Chang et al. |
| 6,577,528 | B2 * | 6/2003 | Gogl et al. ................... 365/158 |
| 6,606,262 | B2 * | 8/2003 | Perner ......................... 365/158 |
| 6,839,269 | B2 * | 1/2005 | Iwata et al. .................. 365/158 |
| 2006/0256461 | A1 * | 11/2006 | Ezaki et al. .................... 360/1 |

* cited by examiner

*Primary Examiner*—Anh Phung
(74) *Attorney, Agent, or Firm*—Oblon, Spivak, McClelland, Maier & Neustadt, P.C.

(57) ABSTRACT

A semiconductor memory according to examples of the present invention includes a word line extending in a first direction, first, second and third bit lines extending in a second direction, a first cell unit connected between the first and second bit lines, a second cell unit connected between the first and third bit lines, and a controller CNT which executes write to a first resistance change element under the condition that the word line is made active and potentials of the first and third bit lines are equalized, and which executes write to a second resistance change element under the condition that the word line is made active and potentials of the first and second bit lines are equalized.

20 Claims, 21 Drawing Sheets

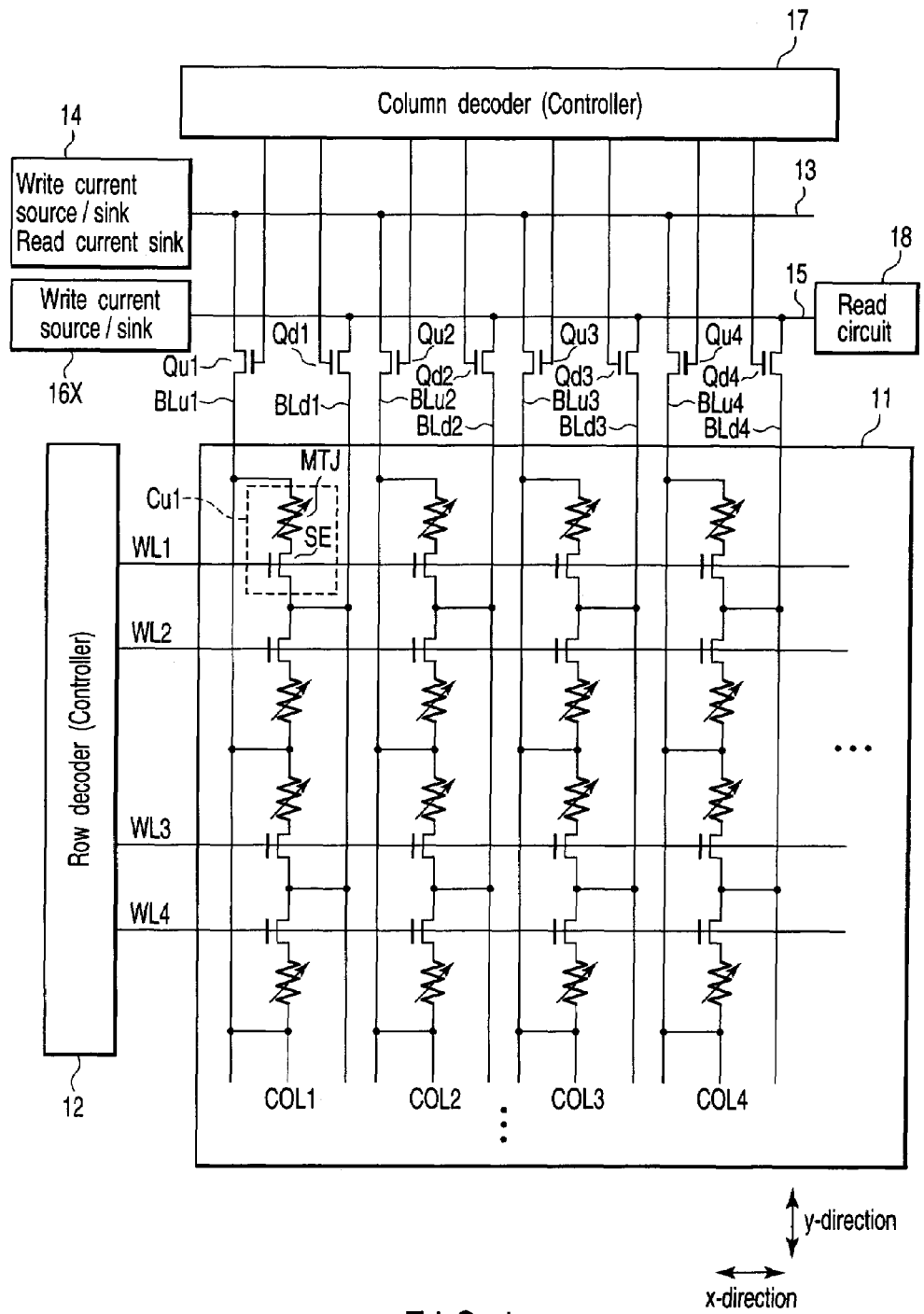
F I G. 1

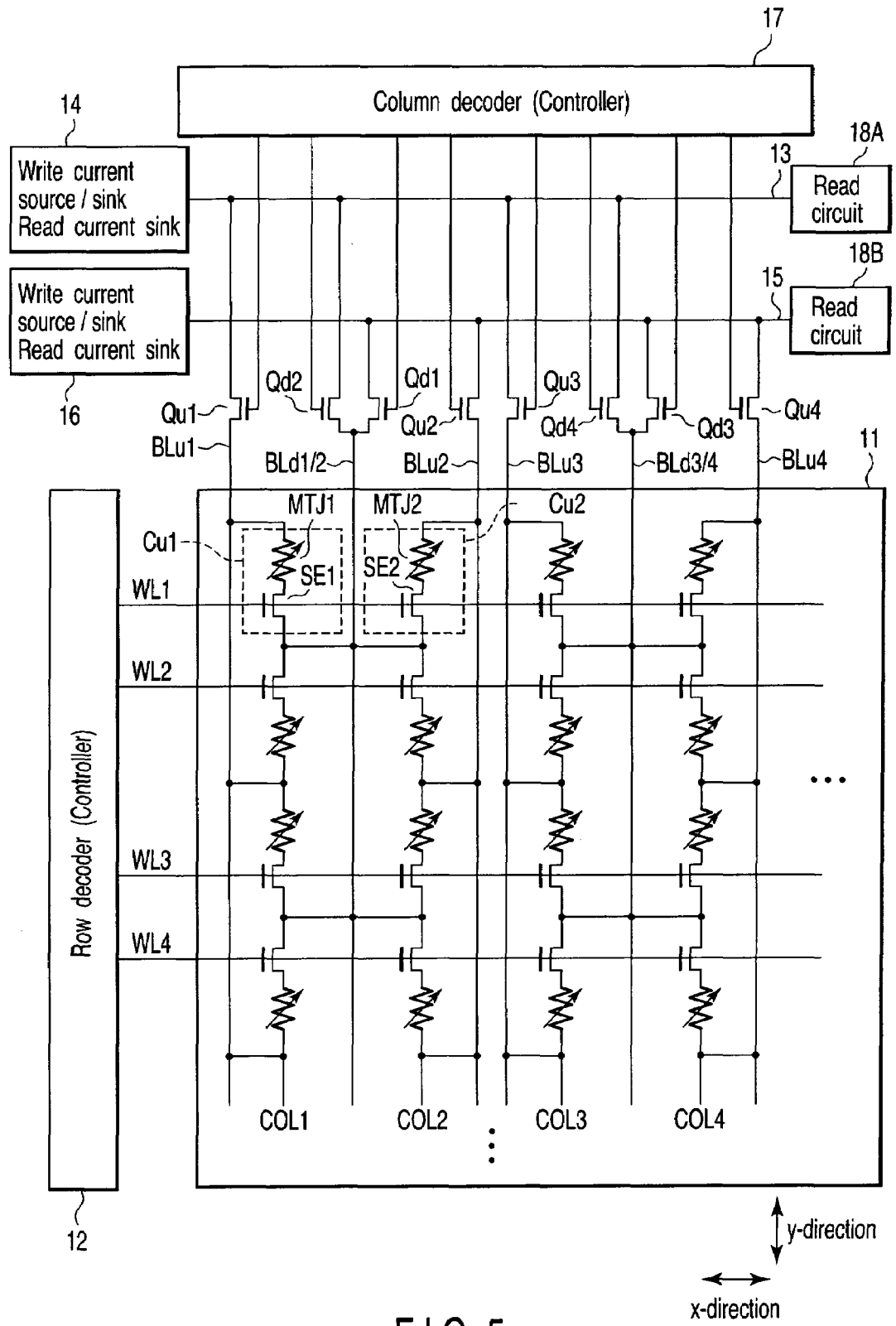
F I G. 5

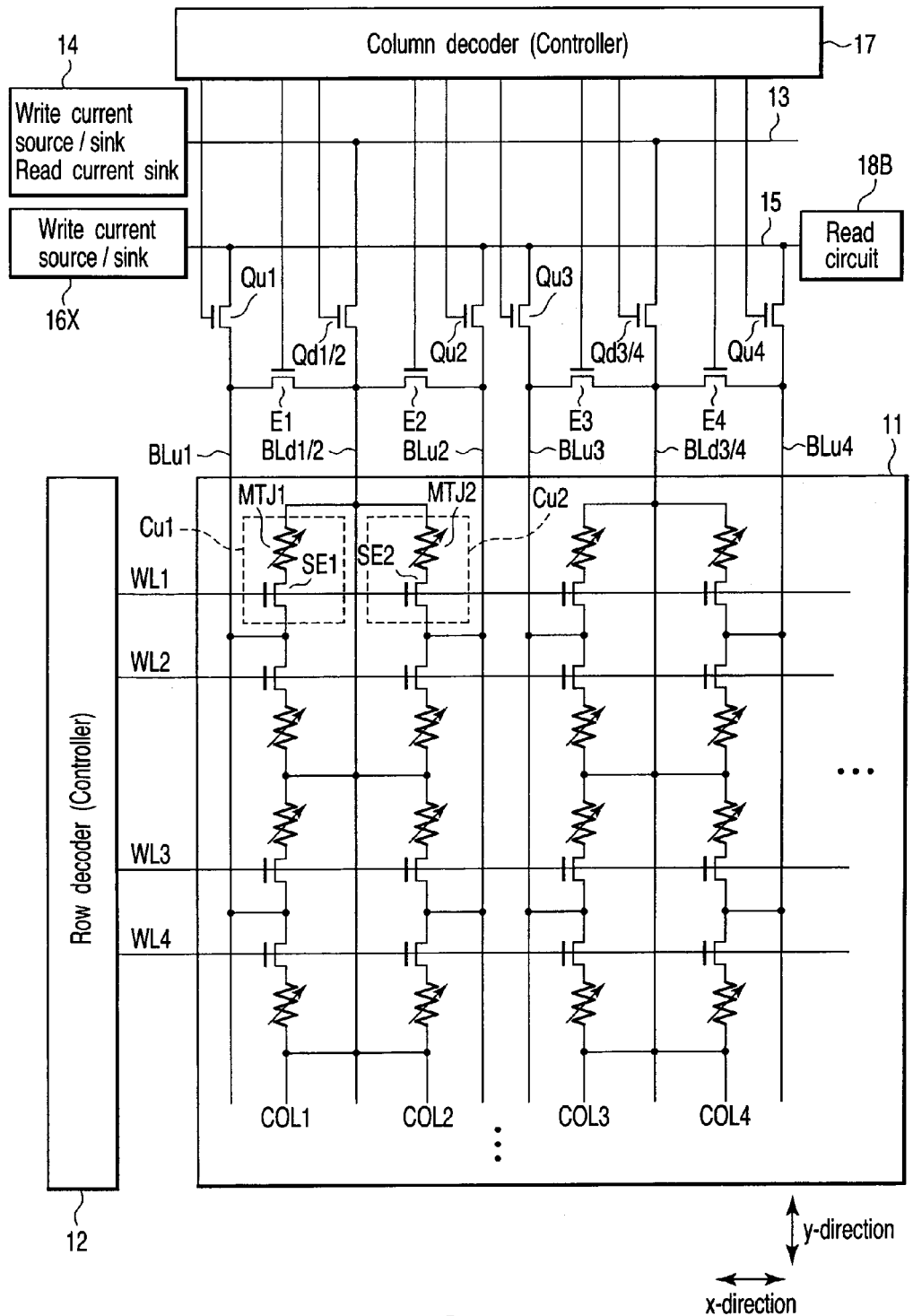
F I G. 18

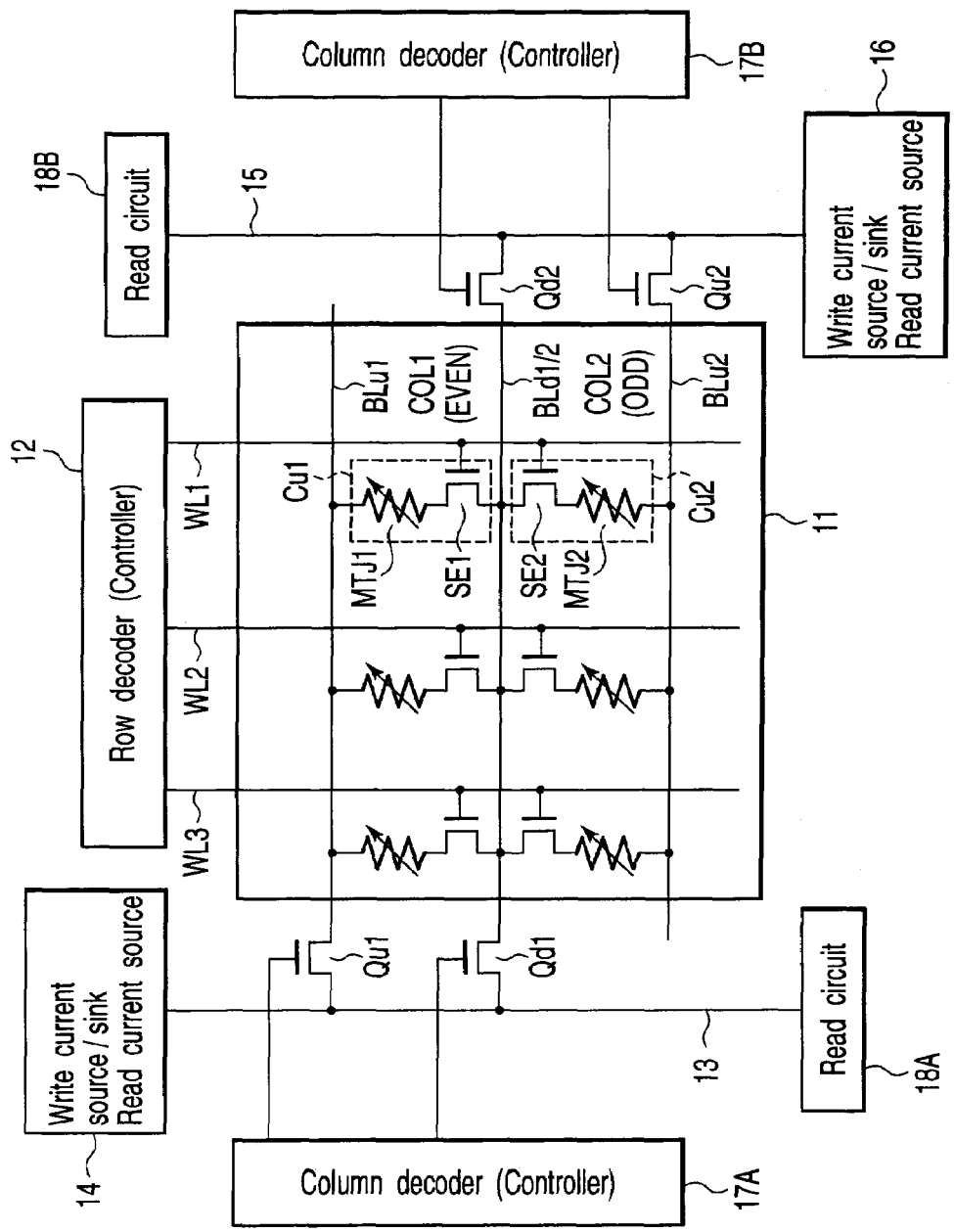
F I G. 24

SEMICONDUCTOR MEMORY HAVING RESISTANCE CHANGE ELEMENT

CROSS-REFERENCE TO RELATED APPLICATIONS

This application is based upon and claims the benefit of priority from prior Japanese Patent Application No. 2006-222005, filed Aug. 16, 2006, the entire contents of which are incorporated herein by reference.

BACKGROUND OF THE INVENTION

1. Field of the Invention

The present invention relates to a layout of a memory cell array of a semiconductor memory having a resistance change element.

2. Description of the Related Art

In recent years, a nonvolatile semiconductor memory using a resistance change element as a memory cell has been attracting attention as a next generation memory. As one of such nonvolatile semiconductor memories, there is a magnetic random access memory using a magnetoresistive element as a memory cell.

The magnetic random access memory is intended to realize a large capacity of more than 1 G bits per chip, and as the technology for realizing this, a technology called spin-injection magnetization reversal has been developed (for instance, refer to the specification of U.S. Pat. No. 5,695,864).

One characteristic of spin-injection magnetization reversal lies in that the magnetization direction of a magnetic free layer is controlled in such a way as to apply a spin torque to electrons of the magnetic free layer while using electrons spin-polarized by the magnetic moment of a magnetic pinned layer. According to this technology, as the magnetoresistive element is miniaturized, a value of a spin injection current necessary for the magnetization reversal also becomes small. Therefore, it is possible to contribute to an increase in the memory capacity and realize lower electric power consumption of the magnetic random access memory.

However, in the write (magnetization reversal) system due to the spin injection, the direction of the spin injection current caused to flow through the magnetoresistive element should be changed in accordance with a value of write data. For this reason, it is necessary to supply the spin injection current to the magnetoresistive element while connecting two bit lines (write lines) to one memory cell.

Therefore, since the bit lines are arranged all over the memory cell array with minimum pitch, manufacturing becomes difficult.

BRIEF SUMMARY OF THE INVENTION

A semiconductor memory according to an aspect of the present invention comprises a word line extending in a first direction, first, second and third bit lines extending in a second direction crossing the first direction, a first cell unit comprised a first resistance change element and a first switch element connected serially between the first and second bit lines, a control terminal of the first switch element being connected to the word line, a second cell unit comprised a second resistance change element and a second switch element connected serially between the first and third bit lines, a control terminal of the second switch element being connected to the word line, and a controller which executes write to the first resistance change element under the condition that the word line is made active and potentials of the first and third bit lines are equalized, and executes write to the second resistance change element under the condition that the word line is made active and potentials of the first and second bit lines are equalized.

BRIEF DESCRIPTION OF THE SEVERAL VIEWS OF THE DRAWING

FIG. 1 is a view showing a semiconductor memory serving as a premise of an example of the invention;

FIG. 5 is a view showing a magnetic random access memory as a first embodiment;

FIG. 18 is a view showing a modified example of a memory cell array;

FIG. 24 is a view showing a magnetic random access memory as a fifth embodiment;

DETAILED DESCRIPTION OF THE INVENTION

Figure 2:
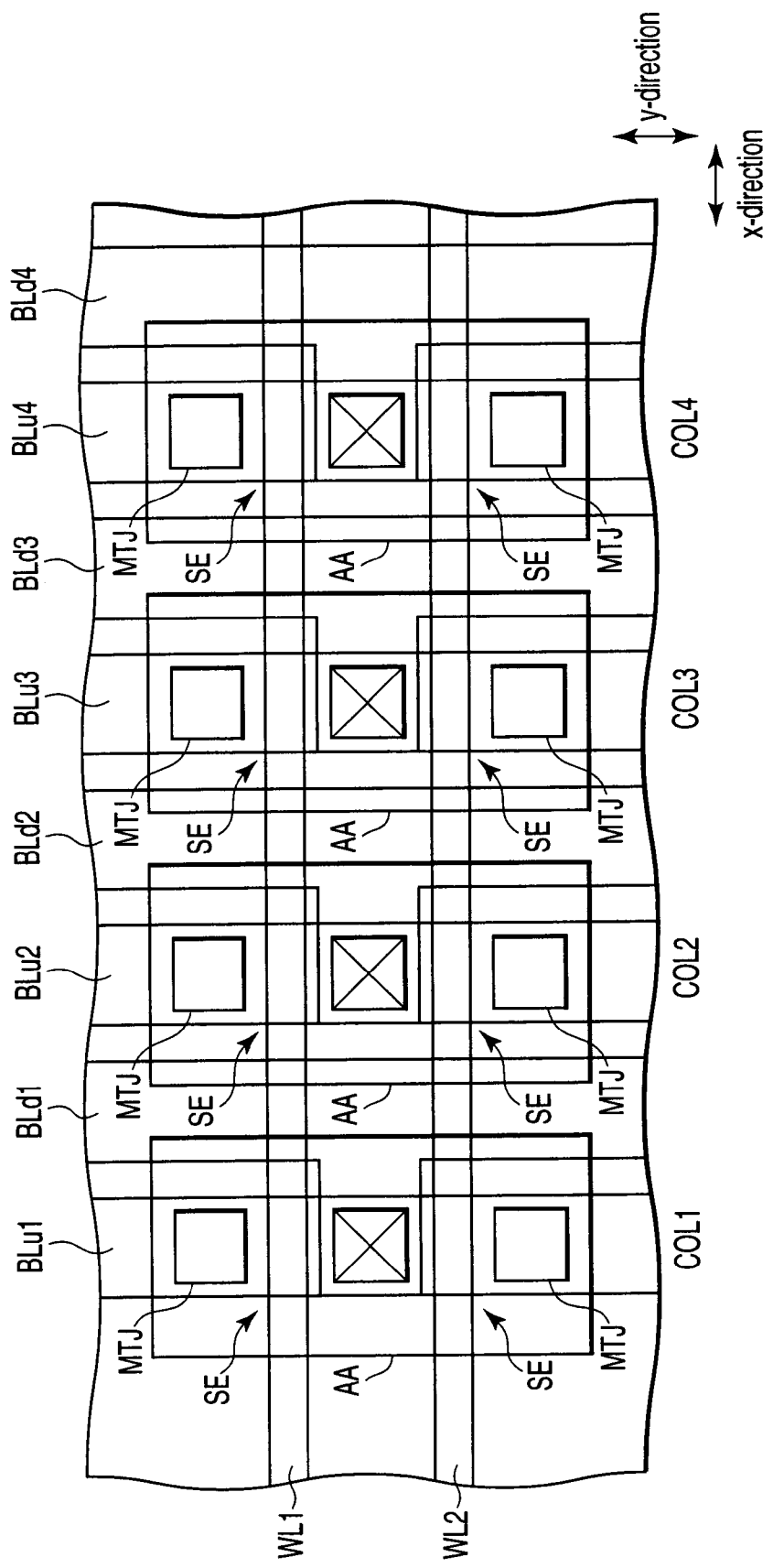
FIG. 2 is a view showing a layout of a memory cell array of FIG. 1.

A semiconductor memory having a resistance change element of an aspect of the present invention will be described below in detail with reference to the accompanying drawings.

1. Outline

In examples of the present invention, a semiconductor memory is an object which has a cell unit (memory cell) in which a current or voltage is applied to a resistance change element, and its state (resistance value) is caused to change. In order to control the direction of write current/voltage applied to the cell unit, two bit lines (write lines) become necessary. In the examples of the invention, two columns being adjacent to each other share one of the two bit lines.

Further, when two columns share one bit line, there is a possibility to generate erroneous write (disturbance), with the write current/voltage supplied to the cell unit in a non-selected column connected to a selected word line.

In the examples of the present invention, in order to avoid this problem of erroneous write, with respect to the two columns sharing the one bit line, there is executed write to a cell unit in the selected column under the condition that the potential of the remaining one bit line in the non-selected column is made the same as the one bit line shared by the two columns.

In this manner, the number of the bit lines on the memory cell array decreases, and the manufacturing process is facilitated without generating the problem of erroneous write.

That is, according to the examples of the present invention, since there may be provided three bit lines to two columns throughout the memory cell array, it is possible to reduce the number of bit lines to $3/4$ as compared with the conventional case in which it is necessary to provide two bit lines to one column.

Therefore, it becomes possible to mitigate the pitch of the bit line and to decrease manufacturing defects such as a short circuit between the bit lines.

2. Semiconductor Memory Having Resistance Change Element

Firstly, there will be described circuit examples of the semiconductor memory in which the state (resistance value) of the resistance change element is changed by the direction of write current.

FIG. 1 shows a principal part of a semiconductor memory having the resistance change element.

In this example, two bit lines (write/read lines) BLuj, BLdj (j=1, 2, 3, 4, . . . ) are arranged in one column. The bit line BLuj is connected to a magnetoresistive element MTJ, while the bit line BLdj is connected to one of two signal terminals of a switch element SE.

The bit line BLuj is connected to a common line 13 via a column switch Quj. The common line 13 is called a common line because all of the bit lines BLuj are connected in common. A write current source/sink and read current sink 14 is connected to the common line 13.

Similarly, the bit line BLdj is connected to a common line 15 via a column switch Qdj. The common line 15 is called a common line because all of the bit lines BLdj are connected in common. A write current source/sink 16X is connected to the common line 15.

A column decoder (controller) 17 is connected to control terminals of the column switches Quj, Qdj, that is, connected to gate terminals of N-channel MOSFETs, to control ON/OFF thereof.

A read circuit 18 is connected to the common line 15.

In such a magnetic random access memory, for instance, when performing write/read to a cell unit Cu1, a word line WL1 is made active, that is, at the "H" level by using a row decoder 12. Further, column switches Qu1, Qd1 are turned ON by using the column decoder 17.

Then, at the time of the write, the write to the magnetoresistive element MTJ in the cell unit Cu1 is executed by causing the spin injection current (write current) in the direction in accordance with a value of the write data to flow between the write current source/sinks 14, 16X. Further, at the time of the read, the read of data (resistance value) from the magnetoresistive element MTJ in the cell unit Cu1 is executed by causing a read current to flow toward the read current sink 14 from the read circuit 18.

The read current is set to a sufficiently smaller value than a value of the write current to avoid generation of erroneous write (disturbance) at the time of the read.

FIG. 2 shows a layout of the memory cell array of the magnetic random access memory of FIG. 1.

Firstly, with respect to this layout, since the focus is on the positional relationship of the bit lines BLuj, BLdj (j=1, 2, 3, 4 . . . ), and the lines indicating respective parts are shown in an non-overlapped manner, it should be noted that the size of each part is not shown accurately.

The bit lines BLuj, BLdj are formed in different layers.

The bit lines BLuj extend in a y direction and are arranged in an x direction side by side with a fixed pitch. Similarly, the bit lines BLdj extend in a y direction and are arranged in an x direction side by side with a fixed pitch.

Each half of the pitch (half pitch) of the bit lines BLuj, BLdj is set to the limit (minimum processing size) of resolution of, for instance, photolithography.

Two switch elements SE are arranged in one element area AA. One of diffusion layers (source/drain) of an N-channel MOSFET as the switch element SE is connected to the bit line BLuj via the magnetoresistive element MTJ. In the present example, the magnetoresistive element MTJ is arranged just below the bit line BLuj.

The other one of the diffusion layers (source/drain) of the N-channel MOSFET as the switch element SE is shared by two switch elements SE in the element area AA, and is connected to the bit line BLdj.

In this layout, two rows among the memory cell array 11 of FIG. 1, that is, only a portion corresponding to word lines WL1, WL2 is indicated. However, a portion corresponding to the word lines WL3, WL4 also has the same layout as FIG. 2. That is, the layout of FIG. 2 is repeated throughout the whole memory cell array.

Thus, the bit lines BLuj, BLdj are arranged all over the memory cell array with the minimum pitch.

3. Fundamental Layout

There will next be described a fundamental layout of a semiconductor memory according to an example of the present invention.

Figure 3:
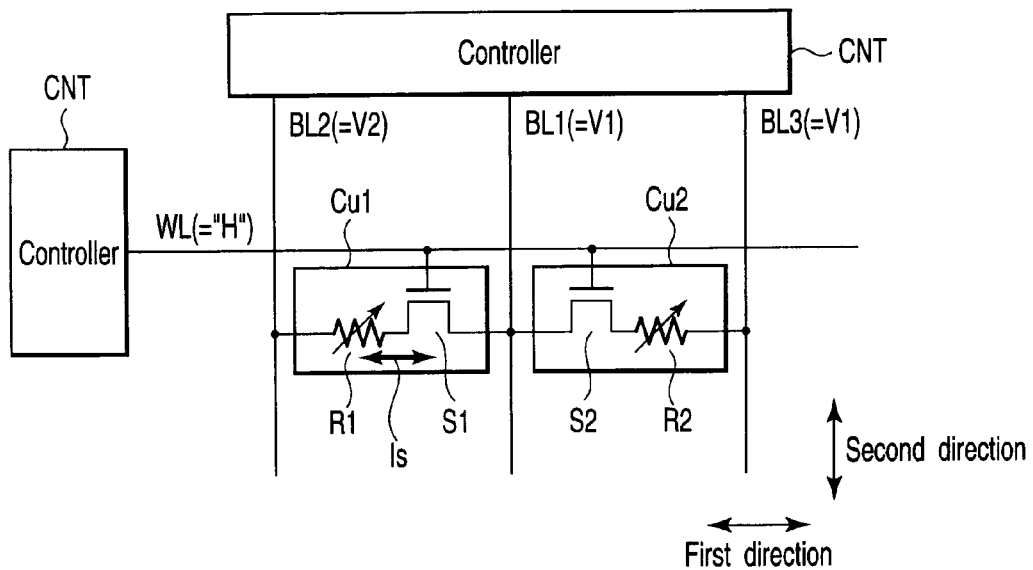
FIG. 3 is a view showing a fundamental layout as an example of the invention.
Figure 4:
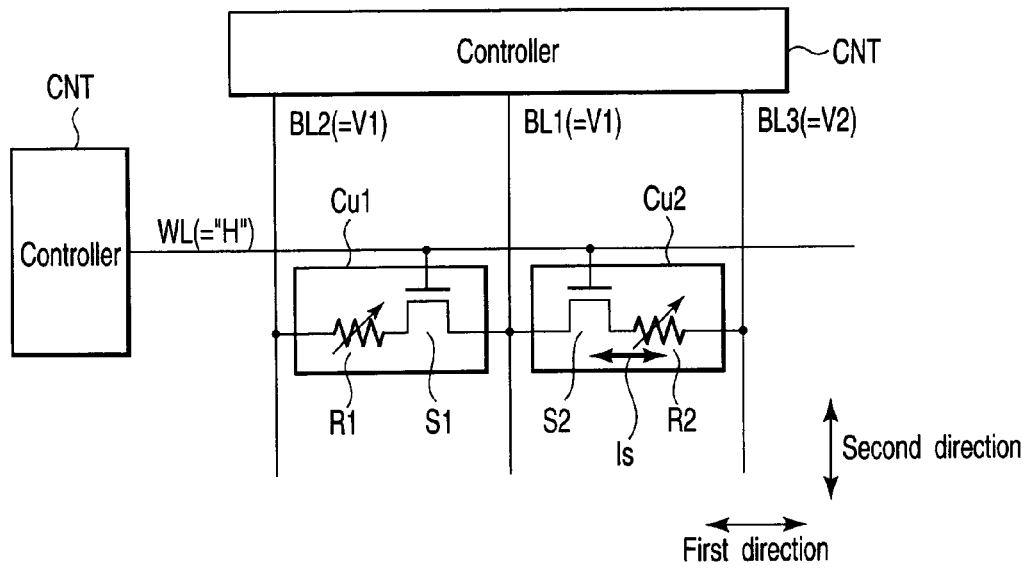
FIG. 4 is a view showing a fundamental layout as an example of the invention.

FIGS. 3 and 4 show the fundamental layout.

The word line WL extends in a first direction, and first, second and third bit lines BL1, BL2, BL3 extend in a second direction crossing the first direction.

A first cell unit Cu1 is comprised a first resistance change element R1 and a first switch element S1 serially connected between the first and second bit lines BL1, BL2, and a control terminal of the first switch element S1 is connected to the word line WL.

A second cell unit Cu2 is comprised a second resistance change element R2 and a second switch element S2 serially connected between the first and third bit lines BL1, BL3, and a control terminal of the second switch element S2 is connected to the word line WL.

Then, a controller CNT, as shown in FIG. 3, makes the word line WL active (="H"), and sets potentials of the first and third bit lines BL1, BL3 to V1 at the time of write to the first resistance change element R1.

By equalizing the potentials of the first and third bit lines BL1, BL3, even though a current or voltage is supplied to the resistance change element R1 with the potential of the second bit line BL2 as V2 (V1>V2 or V1<V2), a current or voltage is not supplied to the resistance change element R2, and thus erroneous write is prevented.

Similarly, the controller CNT, as shown in FIG. 4, makes the word line WL active (="H"), and sets potentials of the first and second bit lines BL1, BL2 to V1 at the time of write to the second resistance change element R2.

By equalizing the potentials of the first and second bit lines BL1, BL2, even though a current or voltage is supplied to the resistance change element R2 with the potential of the third bit line BL3 as V2 (V1>V2 or V1<V2), a current or voltage is not supplied to the resistance change element R1, and thus erroneous write is prevented.

Hereinafter, there will be described a case where a magnetic random access memory is realized by using the above described fundamental layout.

4. EMBODIMENTS

(1) First Embodiment

A. Circuit

FIG. 5 shows a principal part of a magnetic random access memory.

A memory cell array is comprised a plurality of cell units Cu1, Cu2, . . . arranged in an array form. One cell unit is comprised a magnetoresistive element and a switch element connected in series. As the switch element, in the present example, an N-channel MOSFET (field effect transistor) is used.

Word lines WL1, WL2, WL3, WL4, . . . extend in the x direction, and are connected to a control terminal of the switch element, that is, a gate terminal of the N-channel MOSFET. A row decoder 12 is connected to one end of the word lines WL1, WL2, WL3, WL4, . . .

The row decoder 12 makes the selected one word line WLi (i=1, 2, 3, . . . ) active, that is, at the "H" level. The switch element connected to the word line WLi is turned ON.

Although, in order to supply the write current/voltage to the cell unit in one column, it is necessary to provide two bit lines in the one column, here, two columns adjacent to each other share one of the two bit lines.

That is, in each column, the bit line (write/read line) BLuj (j=1, 2, 3, 4 . . . ) is arranged. The bit line BLuj is connected to one end of the magnetoresistive element.

Further, the bit line (write/read line) BLdj'/j'+1 (j'=1, 3, 5 . . . ) is shared by two columns adjacent to each other, that is, shared by a column COLj' and a column COLj'+1. The bit line BLdj'/j'+1 is connected to one of two signal terminals of the switch element.

The bit line BLuj' in the odd number column COLj' is connected to the common line 13 via the column switch Quj'. The common line 13 is called a common line because all of the bit lines BLuj' are connected in common. The write current source/sink and read current sink 14 is connected to the common line 13.

The bit line BLuj'+1 in the even number column COLj'+1 is connected to the common line 15 via the column switch Quj'+1. The common line 15 is called a common line because all of the bit lines BLuj'+1 are connected in common. The write current source/sink and read current sink 16 is connected to the common line 15.

Similarly, the bit line BLdj'/j'+1 is connected to the common line 15 via the column switch Qdj'. Further, the bit line BLdj'/j'+1 is connected to the common line 13 via the column switch Qdj'+1.

The column switches Quj, Qdj, in the present example, are comprised the N-channel MOSFET. The column decoder (controller) 17 is connected to the control terminal of the column switches Quj, Qdj, that is, the gate terminal of the N-channel MOSFET, to control ON/OFF thereof.

The read circuit 18A is connected to the common line 13, while the read circuit 18B is connected to the common line 15.

B. Operation

There will next be described the operation at the time of write/read of the semiconductor memory of FIG. 5.

TABLE 1

|     | Write |     | Read |     |
| --- | --- | --- | --- | --- |
|     | Cu1 | Cu2 | Cu1 | Cu2 |
| Qu1 | On  | On  | On  | On  |
| Qd1 | On  | Off | On  | Off |
| Qu2 | On  | On  | On  | On  |
| Qd2 | Off | On  | Off | On  |
| Qu3 | Off | Off | Off | Off |
| Qd3 | Off | Off | Off | Off |
| Qu4 | Off | Off | Off | Off |
| Qd4 | Off | Off | Off | Off |

Firstly, in the case where write/read is performed to the cell unit Cu1, the word line WL1 is made active, that is, at the "H" level while using the row decoder 12. Further, as shown in Table 1, the column switches Qu1, Qd1 and Qu2 are turned ON, using the column decoder 17.

At this time, the bit line BLu1 is connected to the common line 13 via the column switch Qu1, and the bit lines BLu2, BLd1/2 are connected to the common line 15 respectively via the column switches Qu2, Qd1.

Therefore, the write to the magnetoresistive element MTJ1 in the cell unit Cu1 becomes possible by causing the spin injection current (write current) with a direction in accordance with the value of the write data to flow between the write current source/sinks 14, 16.

At the time of the write to the magnetoresistive element MTJ1, the bit lines BLu2, BLd1/2 are short circuited by the common line 15, and have the same potential. Therefore, the spin injection current does not flow through the magnetoresistive element MTJ2 in the cell unit Cu2, and thus erroneous write is prevented.

Figure 6:
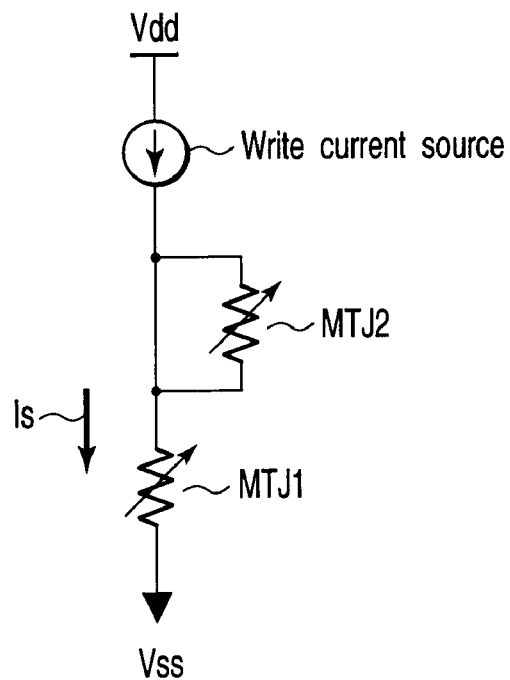
FIG. 6 is a view showing an equivalent circuit at the time of write.

An equivalent circuit of this state is as shown in FIG. 6.

Further, the read from the magnetoresistive element MTJ1 in the cell unit Cu1 becomes possible by causing the read current to flow toward the read current sink 16 from the read circuit 18A or toward the read current sink 14 from the read circuit 18B.

At the time of the read from the magnetoresistive element MTJ1, the bit lines BLu2, BLd1/2 are short circuited by the common line 15, and have the same potential. Therefore, the read current does not flow through the magnetoresistive element MTJ2 in the cell unit Cu2.

Figure 7:
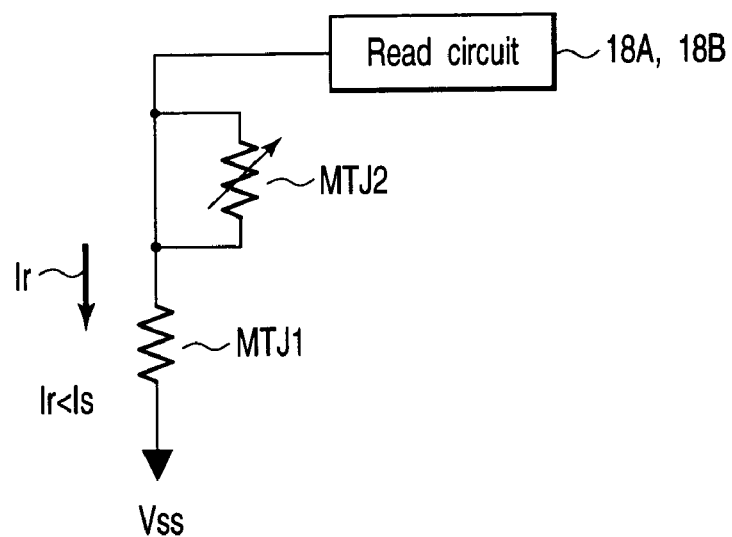
FIG. 7 is a view showing an equivalent circuit at the time of read.

An equivalent circuit of this state is as shown in FIG. 7.

Next, in the case of performing the write/read to the cell unit Cu2, the word line WL1 is made active, that is, at the "H" level while using the row decoder 12. Further, as shown in Table 1, the column switches Qu1, Qu2 and Qd2 are turned ON while using the column decoder 17.

At this time, the bit line BLu2 is connected to the common line 15 via the column switch Qu2, and the bit lines BLu1, BLd1/2 are connected to the common line 13 via the column switches Qu1, Qd2 respectively.

Therefore, the write to the magnetoresistive element MTJ2 in the cell unit Cu2 becomes possible by causing the spin injection current (write current) with a direction in accordance with the value of the write data to flow between the write current source/sinks 14, 16.

At the time of the write to the magnetoresistive element MTJ2, the bit lines BLu1, BLd1/2 are short circuited by the common line 13, and have the same potential. Therefore, the spin injection current does not flow through the magnetoresistive element MTJ1 in the cell unit Cu1, and thus erroneous write is prevented.

Figure 8:
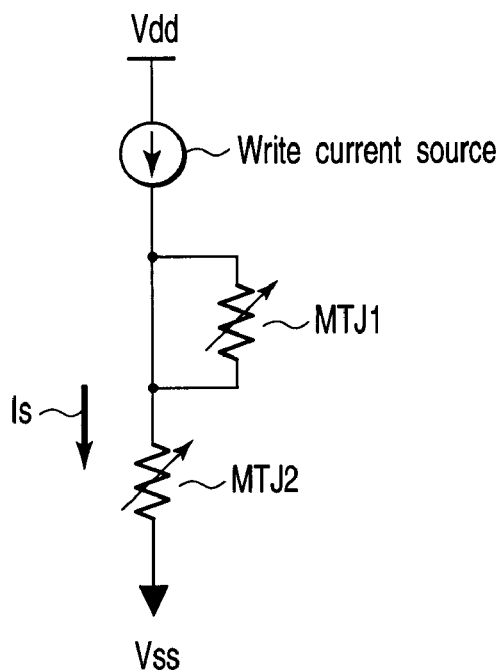
FIG. 8 is a view showing an equivalent circuit at the time of write.

An equivalent circuit of this state is as shown in FIG. 8.

Further, the read from the magnetoresistive element MTJ2 in the cell unit Cu2 becomes possible by causing the read current to flow toward the read current sink 16 from the read circuit 18A or toward the read current sink 14 from the read circuit 18B.

At the time of the read from the magnetoresistive element MTJ2, the bit lines BLu1, BLd1/2 are short circuited by the common line 13, and have the same potential. Therefore, the spin injection current does not flow through the magnetoresistive element MTJ1 in the cell unit Cu1.

Figure 9:
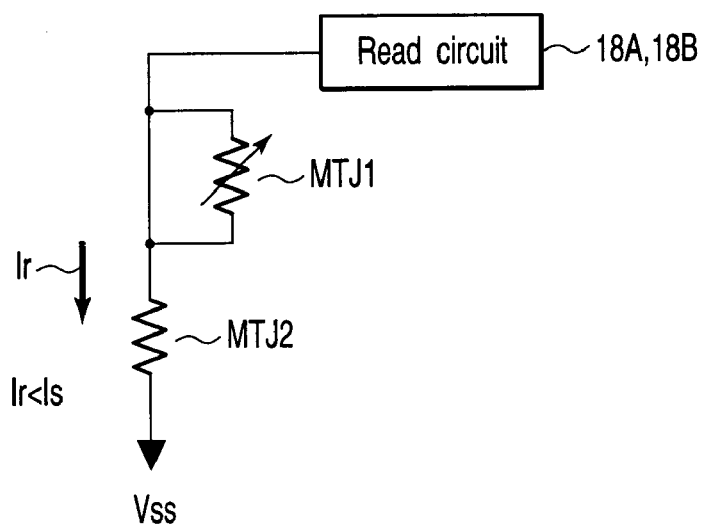
FIG. 9 is a view showing an equivalent circuit at the time of read.

An equivalent circuit of this state is as shown in FIG. 9.

Note that the read current is set to a sufficiently smaller value than a value of the write current to avoid generation of erroneous write (disturbance) at the time of the read.

C. Layout

Figure 10:
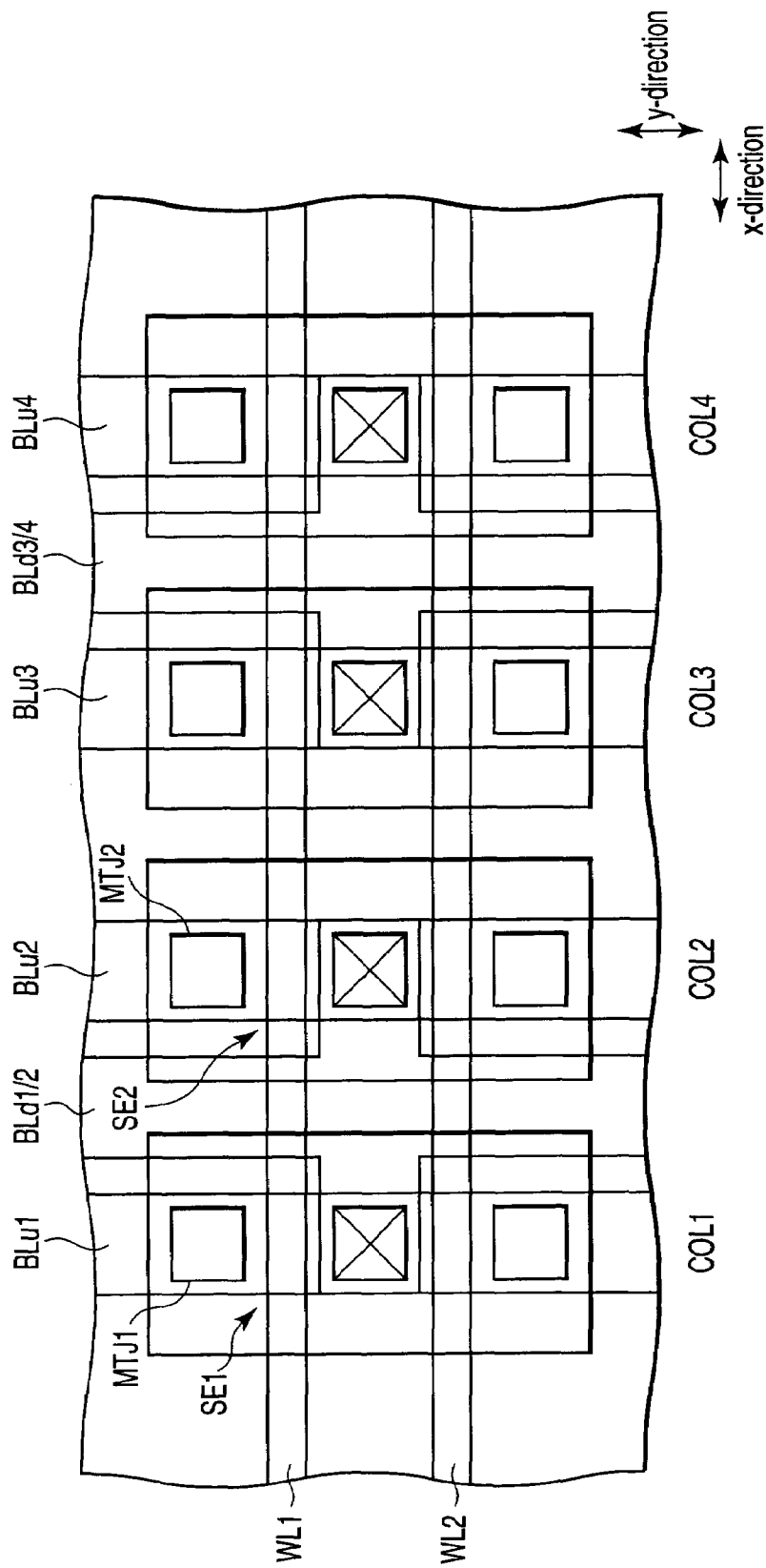
FIG. 10 is a view showing a layout of a memory cell array of FIG. 5.

FIG. 10 shows a layout of the memory cell array of the magnetic random access memory of FIG. 5.

Firstly, for the same reason as that of FIG. 2, the size of each part in this layout is shown to aid understanding, and is not related to its actual size.

The bit lines BLuj, BLdj'/j'+1 are formed in different layers.

The bit lines BLuj extend in a y direction and are arranged in an x direction side by side with a fixed pitch. Each half of the pitch (half pitch) of the bit lines BLuj is set to the limit (minimum processing size) of resolution of, for instance, photolithography.

Similarly, also the bit lines BLdj'/j'+1 extend in a y direction and are arranged in an x direction side by side with a fixed pitch. However, the pitch of the bit line BLdj'/j'+1 is twice the pitch of the bit line BLdj in the comparative example of FIG. 2. This is because the bit line BLdj'/j'+1 is shared by two columns adjacent to each other.

Therefore, for instance, as shown in FIG. 10, a space is secured between the bit line BLd1/2 and the bit line BLd3/4, and the manufacturing process is simplified.

Further, two switch elements are arranged in one element area AA. One of diffusion layers (source/drain) of the N-channel MOSFET as the switch element is connected to the bit line BLuj via the magnetoresistive element. In the present example, the magnetoresistive element is arranged just below the bit line BLuj.

The other one of the diffusion layers (source/drain) of the N-channel MOSFET as the switch element is shared by two switch elements in the element area AA, and is connected to the bit line BLdj'/j'+1.

Note that, with respect to the y direction of the memory cell array, two rows, that is, only parts corresponding to word lines WL1, WL2 are indicated. However, the layout of FIG. 10 is repeated throughout the whole of the memory cell array.

Further, with respect to the x direction of the memory cell array, only four columns of COL1, COL2, COL3 and COL4 are indicated. However, like the y direction, the same layout as that of FIG. 10 is repeated.

D. Modified Example of Read Circuit

There will be described a modified example of the read circuit.

In FIG. 5, the read circuits 18A, 18B are connected to respective two common lines 13, 15. This is because the direction of the read current caused to flow through the magnetoresistive element is fixed without depending on the column COLj.

For instance, in FIG. 5, in the case of performing the read from the magnetoresistive element MTJ1 in the odd column COL1, the read current is caused to flow toward the bit line BLd1/2 (switch element side) from the bit line BLu1 (magnetoresistive element side) while using the read circuit 18A.

Further, in the case of performing the read from the magnetoresistive element MTJ2 in the even column COL2, the read current is caused to flow toward the bit line BLd1/2 (switch element side) from the bit line BLu2 (magnetoresistive element side) while using the read circuit 18B.

In this case, since the direction of the read current flowing through the magnetoresistive element is always the same, it is possible to suppress any read variation to a minimum level.

On the contrary, in the case where the read variation caused by the direction of the read current caused to flow through the magnetoresistive element does not exert a large effect on the read margin, it suffices that the number of the read circuit is one and the read circuit is connected to either one of the common lines 13, 15.

Figure 11:
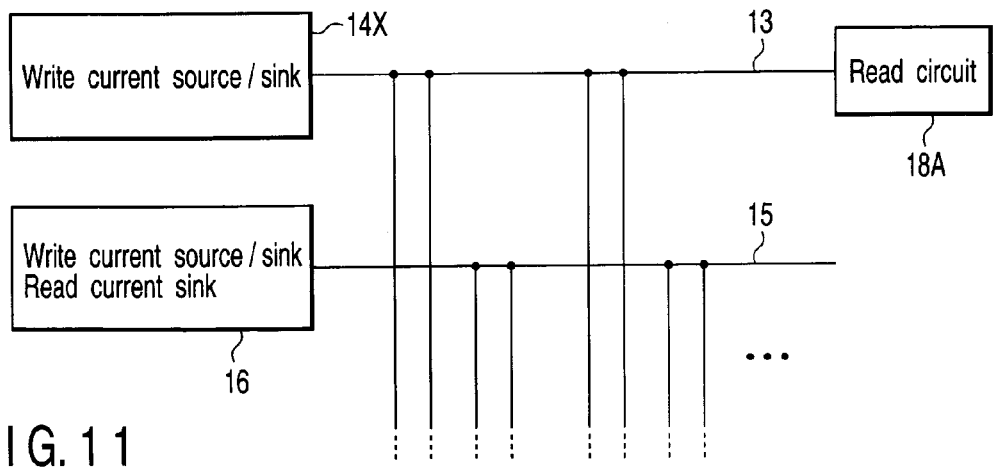
FIG. 11 is a view showing a modified example of a read circuit.

FIG. 11 is an example in which the read circuit 18A is connected to the common line 13. A description of the memory cell array will be omitted because it is the same as that of FIG. 5.

In this case, when there is performed the read from the magnetoresistive element MTJ1 in the odd column COL1 of FIG. 5, the read current flows toward the bit line BLd1/2 (switch element side) from the bit line BLu1 (magnetoresistive element side). Further, when there is performed the read from the magnetoresistive element MTJ2 in the even column COL2, the read current flows toward the bit line BLu2 (magnetoresistive element side) from the bit line BLd1/2 (switch element side).

Figure 12:
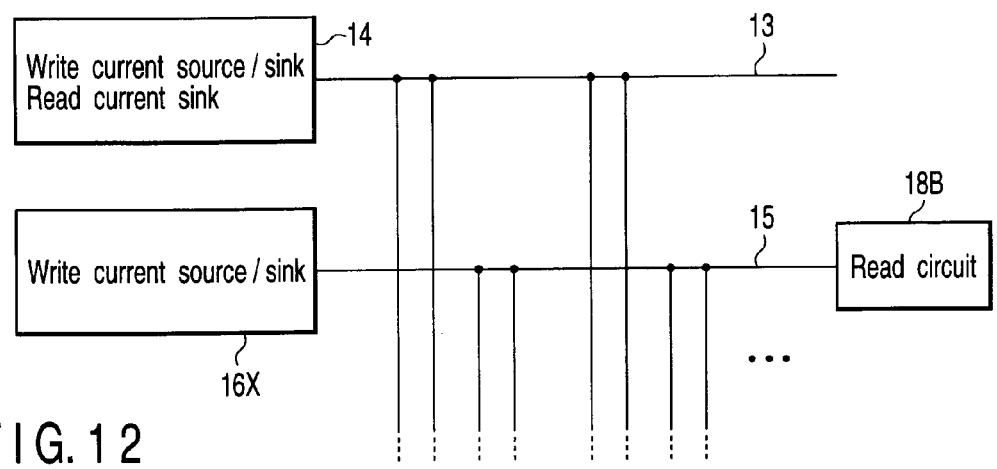
FIG. 12 is a view showing a modified example of a read circuit.

FIG. 12 is an example in which the read circuit 18B is connected to the common line 15. A description with respect to the memory cell array will be omitted because it is the same as that of FIG. 5.

In this case, when there is performed the read from the magnetoresistive element MTJ1 in the odd column COL1 of FIG. 5, the read current flows toward the bit line BLu1 (magnetoresistive element side) from the bit line BLd1/2 (switch element side). Further, when there is performed the read from the magnetoresistive element MTJ2 in the even column COL2, the read current flows toward the bit line BLd1/2 (switch element side) from the bit line BLu2 (magnetoresistive element side).

Further, there will be described a technique for fixing the direction of the read current for all of the magnetoresistive elements, and for decreasing the number of the read circuits.

Figure 13:
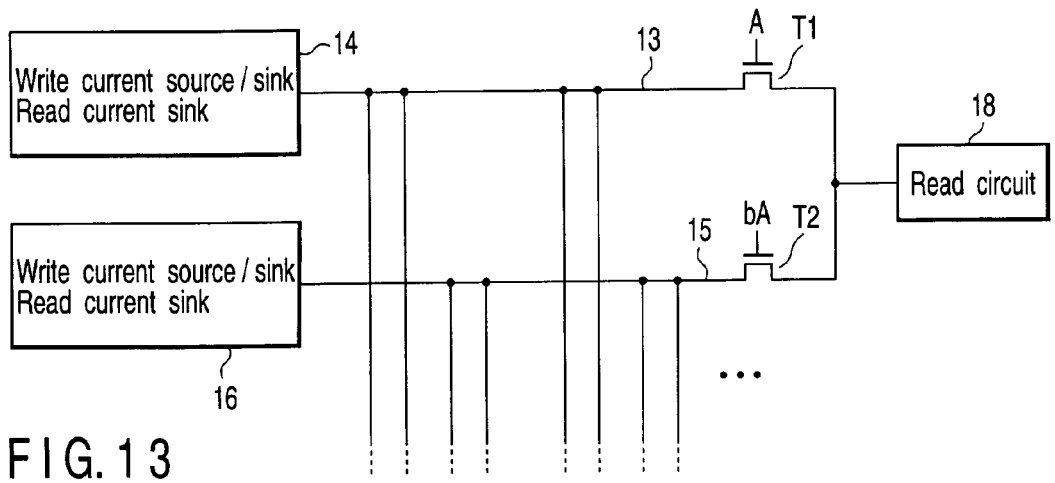
FIG. 13 is a view showing a modified example of a read circuit.

FIG. 13 is an example in which one read circuit 18 is connected to the common lines 13, 15 via each of switch elements T1, T2.

In this case, for instance, in FIG. 5, when performing the read from the magnetoresistive element MTJ1 in the odd column COL1, a control signal A is made "H", a control signal bA is made "L", the switch element T1 is turned ON, and the switch element T2 is turned OFF.

At this time, since the circuit of FIG. 13 becomes the same as the circuit of FIG. 11, it is possible to cause the read current to flow toward the bit line BLd1/2 (switch element side) from the bit line BLu1 (magnetoresistive element side) while using the read circuit 18.

Further, when performing the read from the magnetoresistive element MTJ2 in the even column COL2, a control signal bA is made "H", a control signal A is made "L", the switch element T1 is turned OFF, and the switch element T2 is turned ON.

At this time, since the circuit of FIG. 13 is the same as the circuit of FIG. 12, it is possible to cause the read current to flow toward the bit line BLd1/2 (switch element side) from the bit line BLu2 (magnetoresistive element side) while using the read circuit 18.

E. Modified Example of Memory Cell Array

There will next be described a modified example of the memory cell array.

Figure 14:
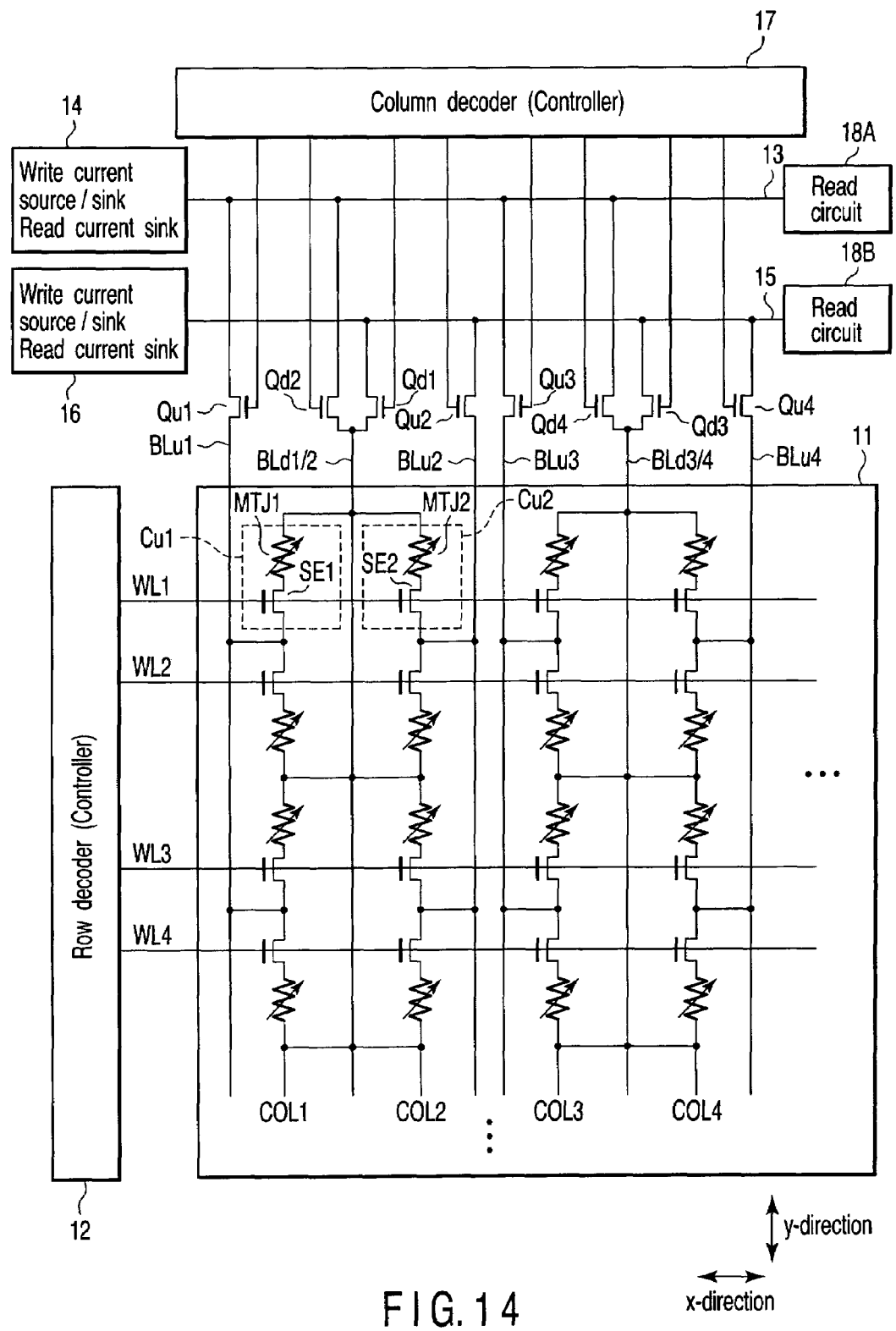
FIG. 14 is a view showing a modified example of a memory cell array.

FIG. 14 shows a principal part of the magnetic random access memory.

The present example is different from FIG. 5 in that the magnetoresistive element in the cell unit is connected to the bit line BLdj'/j'+1, and the switch element in the cell unit is connected to the bit line BLuj.

The other features are the same as those of FIG. 5. Further, the operation is the same as that of FIGS. 6 to 9, and the read circuit is the same as that of FIGS. 11 to 13.

Figure 15:
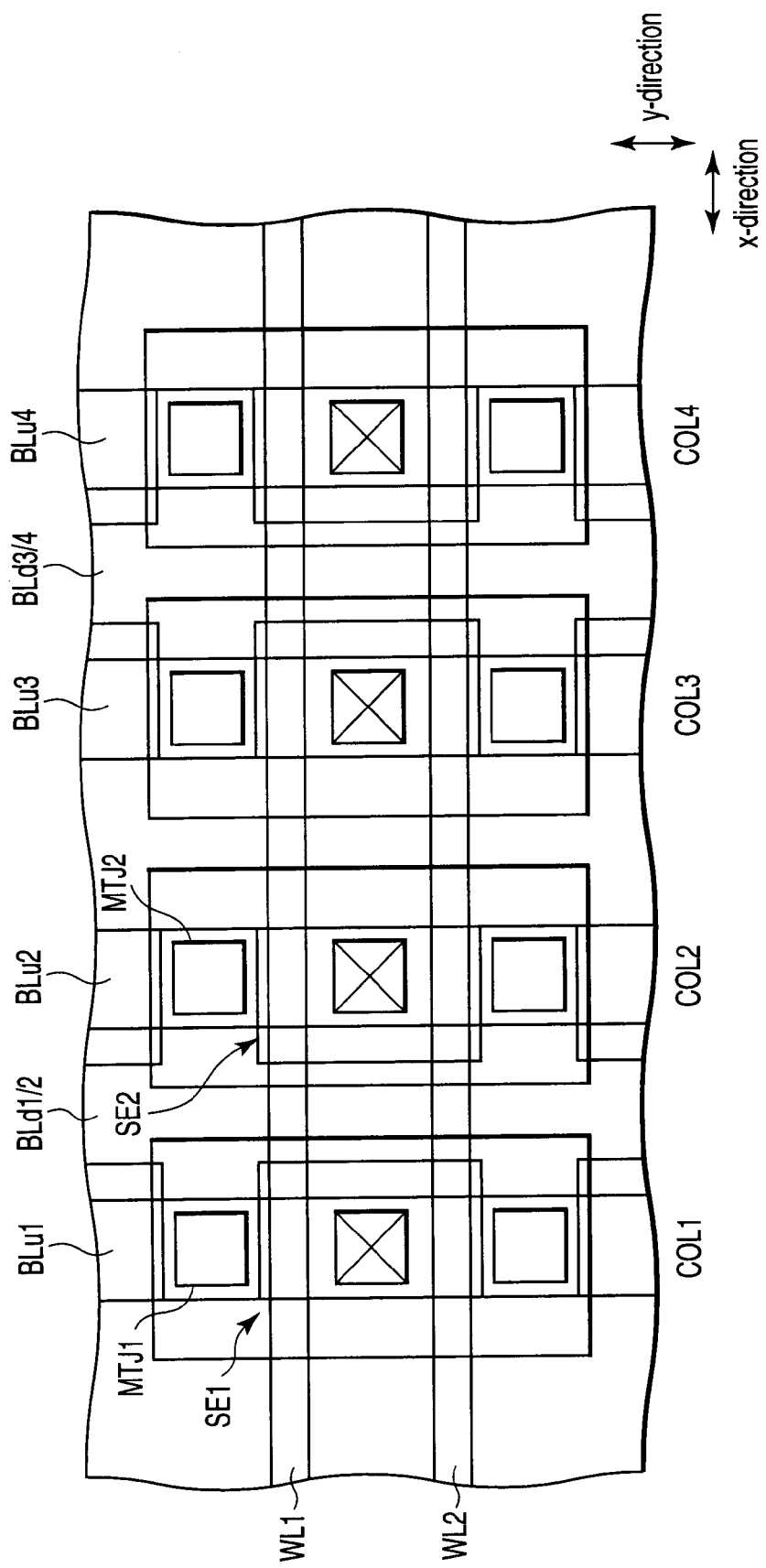
FIG. 15 is a view showing a layout of the memory cell array of FIG. 14.

FIG. 15 shows a layout of the memory cell array.

In the present example, like FIG. 10, the pitch of the bit line BLdj'/j'+1 is twice the pitch of the bit line BLdj in the comparative example of FIG. 2, and thus, manufacturing process is facilitated.

The present example is different from FIG. 10 in that one of diffusion layers (source/drain) of the N-channel MOSFET as the switch element is connected to the bit line BLdj'/j'+1 via the magnetoresistive element, and the other one which is shared by two switch elements in the element area AA is connected to the bit line BLuj.

F. Other Modified Example

Figure 26:
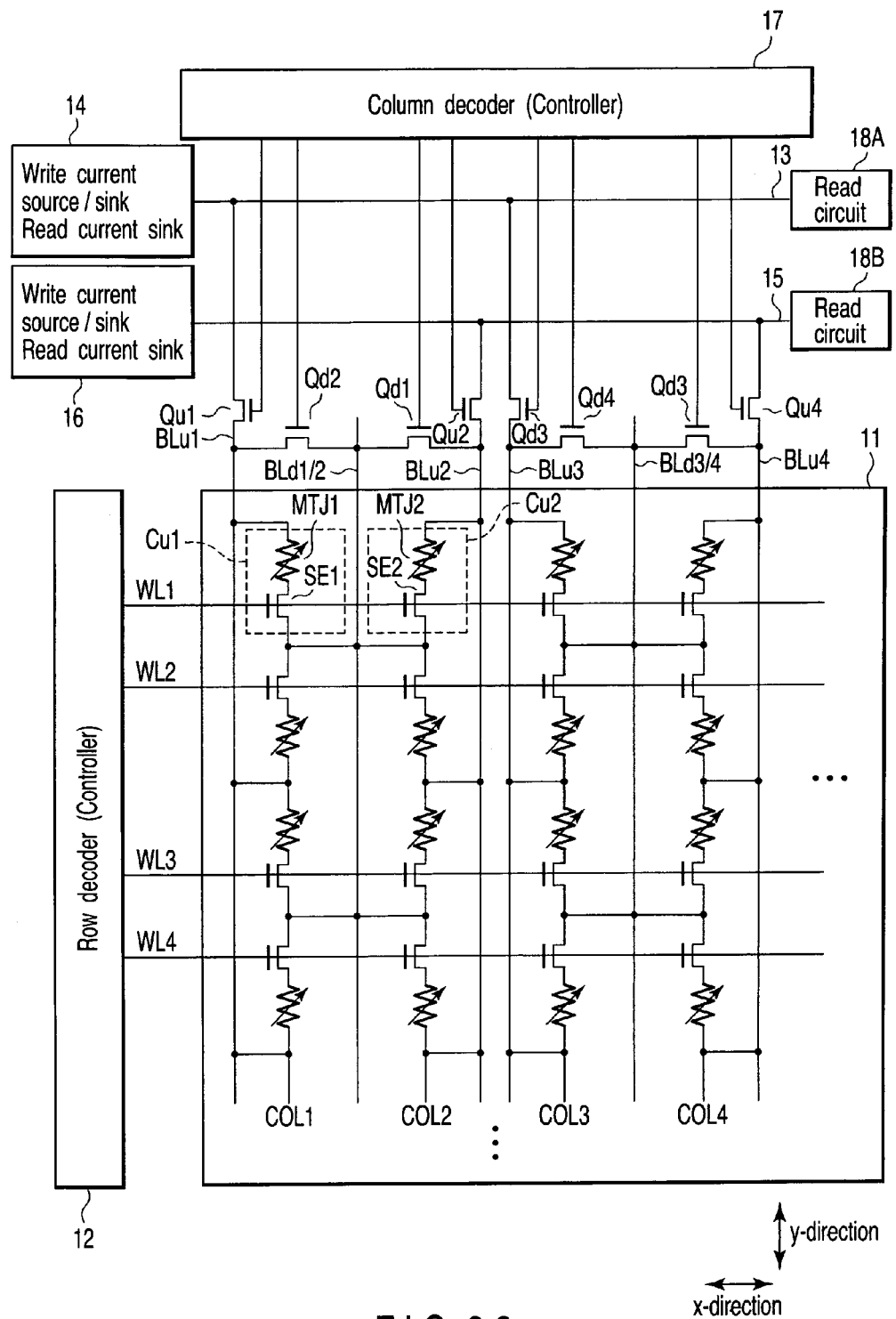
FIG. 26 is a view showing a modified example of the first embodiment.

FIG. 26 shows a modified example of the semiconductor memory of FIG. 5.

A characteristic of the semiconductor memory lies in that the column switch Qd1 is connected between the bit lines BLu2, BLd1/2, the column switch Qd2 is connected between the bit lines BLu1, BLd1/2, the column switch Qd3 is connected between the bit lines BLu4, BLd3/4, and the column switch Qd4 is connected between the bit lines BLu3, BLd3/4.

The other constitution is the same as that of the semiconductor memory of FIG. 5.

Since the operation is the same as that of the semiconductor memory of FIG. 5, here, its description will be omitted.

G. Summary

As described above, according to the first embodiment, the manufacturing process can be facilitated by reducing the number of write lines on the memory cell array.

Note that, although it has been assumed that the bit line BLuj and the bit line BLdj'/j'+1 are formed on different layers, all of the bit lines may be formed in the same layer, if possible.

Further, when forming the bit line BLuj and the bit line BLdj'/j'+1 on different layers, the bit line BLuj is on an upper layer and the bit line BLdj'/j'+1 is on a lower layer, and vice versa.

(2) Second Embodiment

A. Circuit

Figure 16:
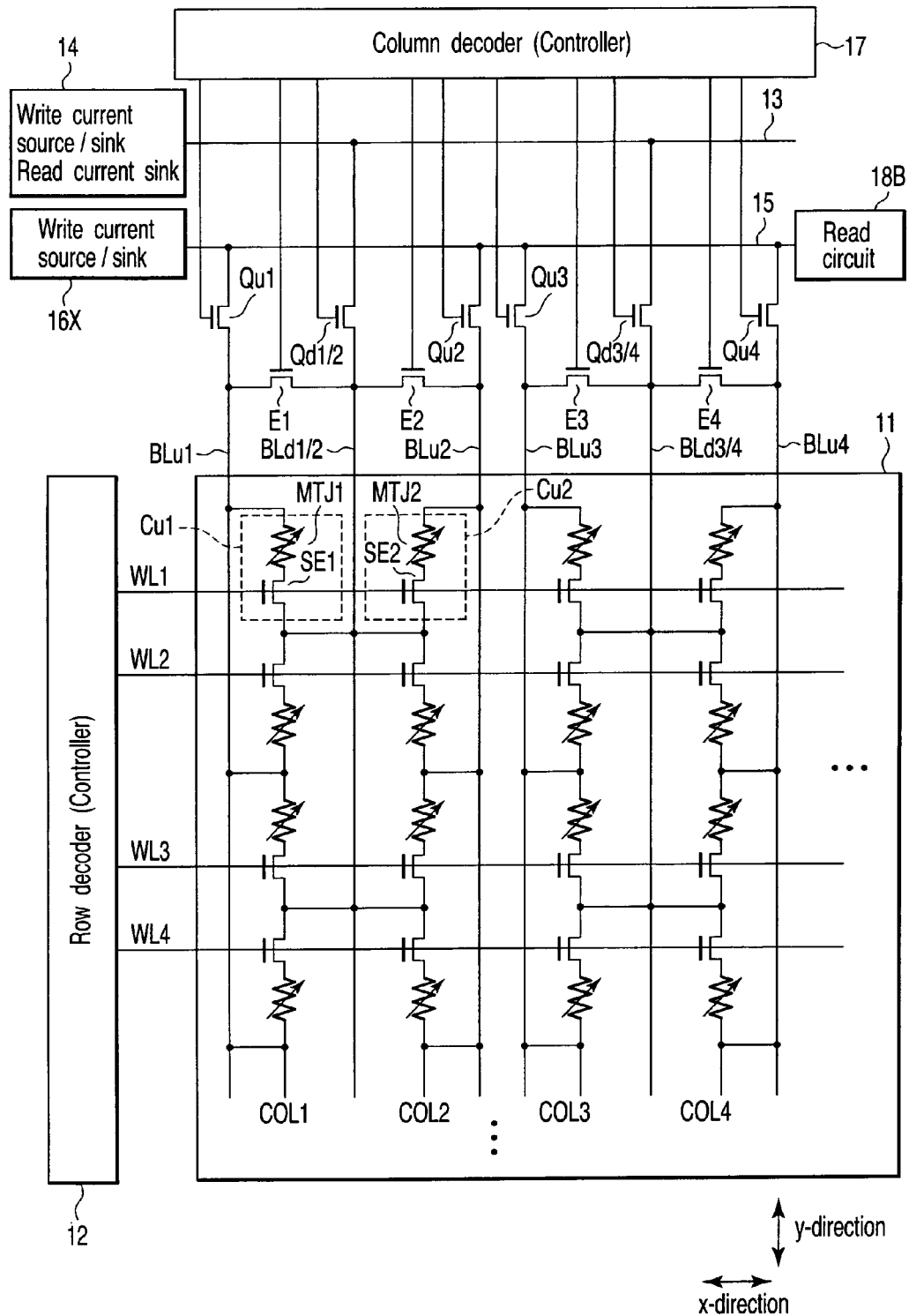
FIG. 16 is a view showing a magnetic random access memory as a second embodiment.

FIG. 16 shows a principal part of the magnetic random access memory.

The memory cell array 11 and the row decoder 12 are the same as those of FIG. 5.

Like FIG. 5, one of two bit lines necessary for the write/read is shared by two columns adjacent to each other.

That is, the bit line (write/read line) BLuj (j=1, 2, 3, 4, . . . ) is arranged in respective columns. The bit line BLuj is connected to one end of the magnetoresistive element.

Further, the bit line (write/read line) BLdj'/Jj'+1 (j'=1, 3, 5, . . . ) is shared by two columns adjacent to each other, that is, shared by the column COLj' and the column COLj'+1.

The bit line BLdj'/j'+1 is connected to one of two signal terminals of the switch element.

The bit line BLuj' in the odd number column COLj' is connected to the common line 15 via the column switch Quj'. The common line 15 is called a common line because all of bit lines BLuj' are connected in common. The write current source/sink and read current sink 16X is connected to the common line 15.

Similarly, the bit line BLuj'+1 in the even number column COLj'+1 is connected to the common line 15 via the column switch Quj'+1.

The bit line BLdj'/j'+1 is connected to the common line 13 via the column switch Qdj'/j'+1.

In the present example, a column switch (equalizer) Ej' for short circuiting the bit line BLuj' and the bit line BLdj'/j'+1 is further connected between both the bit lines, and a column switch (equalizer) Ej'+1 for short circuiting the bit line BLuj'+1 and the bit line BLdj'/j'+1 is connected between both the bit lines.

In the present example, respective column switches Quj, Qdj, Ej, and Ej'+1 are comprised the N-channel MOSFET.

The column decoder (controller) 17 is connected to the control terminal of the column switches Quj, Qdj, Ej, and Ej'+1, that is, the gate terminal of the N-channel MOSFET, to control its ON/OFF.

The read circuit 18B is connected to the common line 15.

B. Operation

There will next be described the operation at the time of the write/read of the semiconductor memory of FIG. 16.

TABLE 2

| | Write | | Read | |
|---|---|---|---|---|
| | Cu1 | Cu2 | Cu1 | Cu2 |
| Qu1 | On | Off | On | Off |
| Qd1/2 | On | On | On | On |
| Qu2 | Off | On | Off | On |
| Qu3 | Off | Off | Off | Off |
| Qd3/4 | Off | Off | Off | Off |
| Qu4 | Off | Off | Off | Off |
| E1 | Off | On | Off | On |
| E2 | On | Off | On | Off |
| E3 | Off | Off | Off | Off |
| E4 | Off | Off | Off | Off |

Firstly, in the case where write/read is performed to the cell unit Cu1, the word line WL1 is made active, that is, at the "H" level while using the row decoder 12. Further, as shown in Table 2, the column switches Qu1, Qd1/2 and E2 are turned ON, using the column decoder 17.

At this time, the bit line BLu1 is connected to the common line 15 via the column switch Qu1, and the bit line BLd1/2 is connected to the common line 13 via the column switch Qd1/2. Further, the bit line BLu2 is short circuited to the bit line BLd1/2 by the column switch (equalizer) E2.

Therefore, the write to the magnetoresistive element MTJ1 in the cell unit Cu1 becomes possible by causing the spin injection current (write current) with a direction in accordance with the value of the write data to flow between the write current source/sinks 14, 16X.

At the time of the write to the magnetoresistive element MTJ1, the bit lines BLu2, BLd1/2 have the same potential. Therefore, the spin injection current does not flow through the magnetoresistive element MTJ2 in the cell unit Cu2, and thus erroneous write is prevented.

An equivalent circuit of this state is as shown in FIG. 6.

Further, the read from the magnetoresistive element MTJ1 in the cell unit Cu1 becomes possible by causing the read current to flow toward the read current sink 14 from the read circuit 18B. At this time, the read current flows toward the switch element from the magnetoresistive element in the cell unit.

At the time of the read from the magnetoresistive element MTJ1, the bit lines BLu2, BLd1/2 have the same potential, and therefore, the read current does not flow through the magnetoresistive element MTJ2 in the cell unit Cu2.

An equivalent circuit of this state is as shown in FIG. 7.

Next, in the case where write/read is performed to the cell unit Cu2, the word line WL1 is made active, that is, at the "H" level while using the row decoder 12. Further, as shown in Table 2, the column switches Qd1/2, Qu2 and E1 are turned ON, using the column decoder 17.

At this time, the bit line BLu2 is connected to the common line 15 via the column switch Qu2, and the bit line BLd1/2 is connected to the common line 13 via the column switch Qd1/2. Further, the bit line BLu1 is short circuited to the bit line BLd1/2 by the column switch (equalizer) E1.

Therefore, the write to the magnetoresistive element MTJ2 in the cell unit Cu2 becomes possible by causing the spin injection current (write current) with a direction in accordance with the value of the write data to flow between the write current source/sinks 14, 16X.

At the time of the write to the magnetoresistive element MTJ2, the bit lines BLu1, BLd1/2 have the same potential. Therefore, the spin injection current does not flow through the magnetoresistive element MTJ1 in the cell unit Cu1, and thus erroneous write is prevented.

An equivalent circuit of this state is as shown in FIG. 8.

Further, the read from the magnetoresistive element MTJ2 in the cell unit Cu2 becomes possible by causing the read current to flow toward the read current sink 14 from the read circuit 18B.

At this time, the read current flows toward the switch element from the magnetoresistive element in the cell unit. That is, the read current always has the same direction, regardless of the position of the selected cell unit (magnetoresistive element).

At the time of the read from the magnetoresistive element MTJ2, the bit lines BLu1, BLd1/2 have the same potential. Therefore, the read current does not flow through the magnetoresistive element MTJ1 in the cell unit Cu1.

An equivalent circuit of this state is as shown in FIG. 9.

Note that the read current is set to a sufficiently smaller value than a value of the write current to avoid generation of erroneous write (disturbance) at the time of the read.

C. Layout

The layout of the memory cell array is the same as that of FIG. 10.

Therefore, for instance, as shown in FIG. 10, the manufacturing process can be facilitated by decreasing the number of write lines on the memory cell array.

D. Modified Example of Read Circuit

In the second embodiment, if the read circuit is connected to one of two common lines 13, 15, as is clear from the above description of the operation, the read current applied to the magnetoresistive element always has the same direction.

Figure 17:
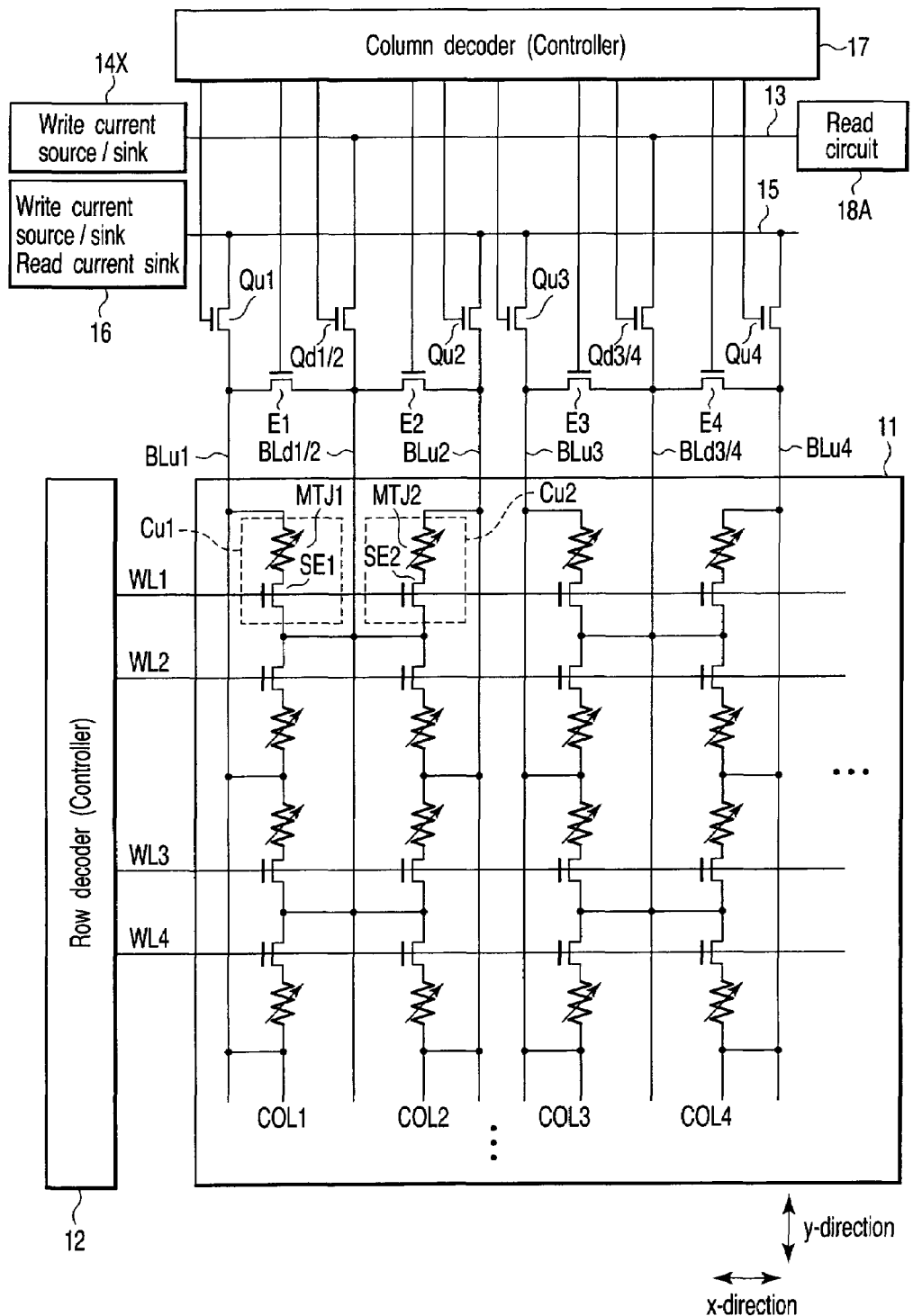
FIG. 17 is a view showing a modified example of a read circuit.

Therefore, although the read circuit 18B is connected to the common line 15 in the example of FIG. 16, it is also possible to connect the read circuit 18A to the common line 13 as shown in FIG. 17.

In this case, the write current source/sink and read current sink 16 is connected to the common line 15, while the write current source/sink 14X is connected to the common line 13.

E. Modified Example of Memory Cell Array

FIG. 18 shows a principal part of the magnetic random access memory.

The present example is different from FIG. 16 in that the magnetoresistive element in the cell unit is connected to the bit line BLdj'/j'+1, and the switch element in the cell unit is connected to the bit line BLuj.

The other elements (circuit, operation and the like) are the same as those of FIG. 16.

Further, the layout of the memory cell array is the same as that of FIG. 15.

F. Summary

As described above, according to the second embodiment, the manufacturing process can be facilitated by decreasing the number of write lines on the memory cell array.

Note that, although it has been assumed that the bit line BLuj and the bit line BLdj'/j'+1 are formed on different layers, all of the bit lines may be formed in the same layer, if possible.

Further, when forming the bit line BLuj and the bit line BLdj'/j'+1 on different layers, the bit line BLuj is on an upper layer and the bit line BLdj'/j'+1 is on a lower layer, and vice versa.

(3) Third Embodiment

A third embodiment relates to a spin injection magnetic random access memory of a double gate structure.

Parts other than the memory cell array, that is, the controller (row/column decoder), the column switch, the common line, the read circuit, and the like, are the same as those in the first and second embodiments, and thus, description thereof will be omitted here.

Therefore, hereinafter there will be described a layout of a memory cell array in the case where an example of the present invention is applied to a spin injection magnetic random access memory of a double gate structure.

Figure 19:
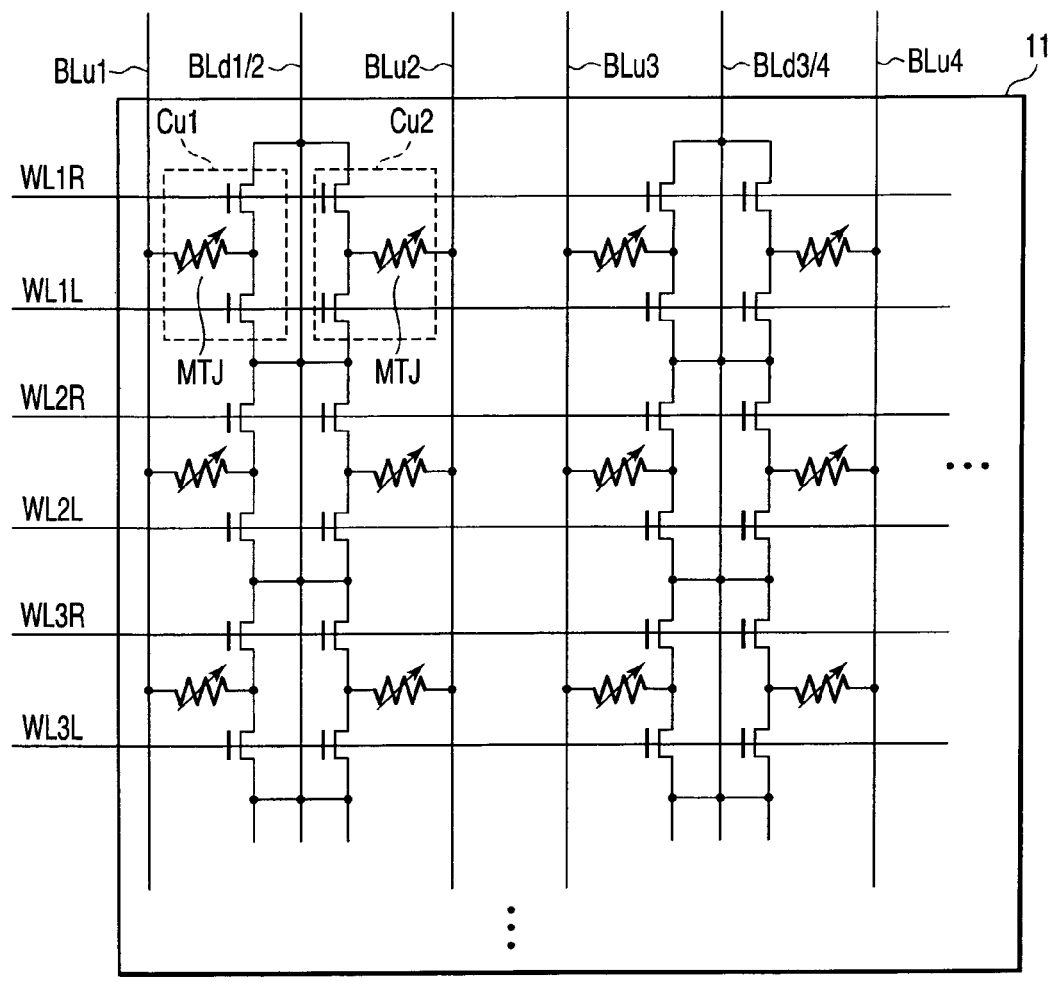
FIG. 19 is a view showing a memory cell array as a third embodiment.

FIG. 19 shows a memory cell array of a double gate structure.

The memory cell array is comprised a plurality of cell units Cu1, Cu2, . . . arranged in an array form. One cell unit is comprised a magnetoresistive element and a switch element connected in series. As the switch element, in the present example, two N-channel MOSFETs (field effect transistor) connected in parallel are used.

Word lines WL1R, WL1L, WL2R, WL2L, WL3R, WL3L, . . . extend in the x direction, and are connected to control terminals of the switch elements, that is, gate terminals of the N-channel MOSFETs. The row decoder 12 is connected to each one end of the word lines WL1R, WL1L, WL2R, WL2L, WL3R, WL3L . . . .

The row decoder 12 makes a selected one word line WLiR, WLiL (i=1, 2, 3, . . . ) active, that is, at the "H" level. The switch element connected to the word line WLiR, WLiL is turned ON.

It is necessary to provide two bit lines in one column in order to supply the write current/voltage to the cell unit in the one column, and one of the two bit lines is shared by two columns adjacent to each other.

That is, the bit line (write/read line) BLuj (j=1, 2, 3, 4, . . . ) is arranged in each column. The bit line BLuj is connected to one end of the magnetoresistive element in the cell unit.

Further, bit line (write/read line) BLdj'/j'+1 (j'=1, 3, 5, . . . ) is shared by two columns adjacent to each other, that is, the column COLj' and the column COLj'+1. The bit line BLdj'/j'+1 is connected to one of two signal terminals of the switch element in the cell unit.

Figure 20:
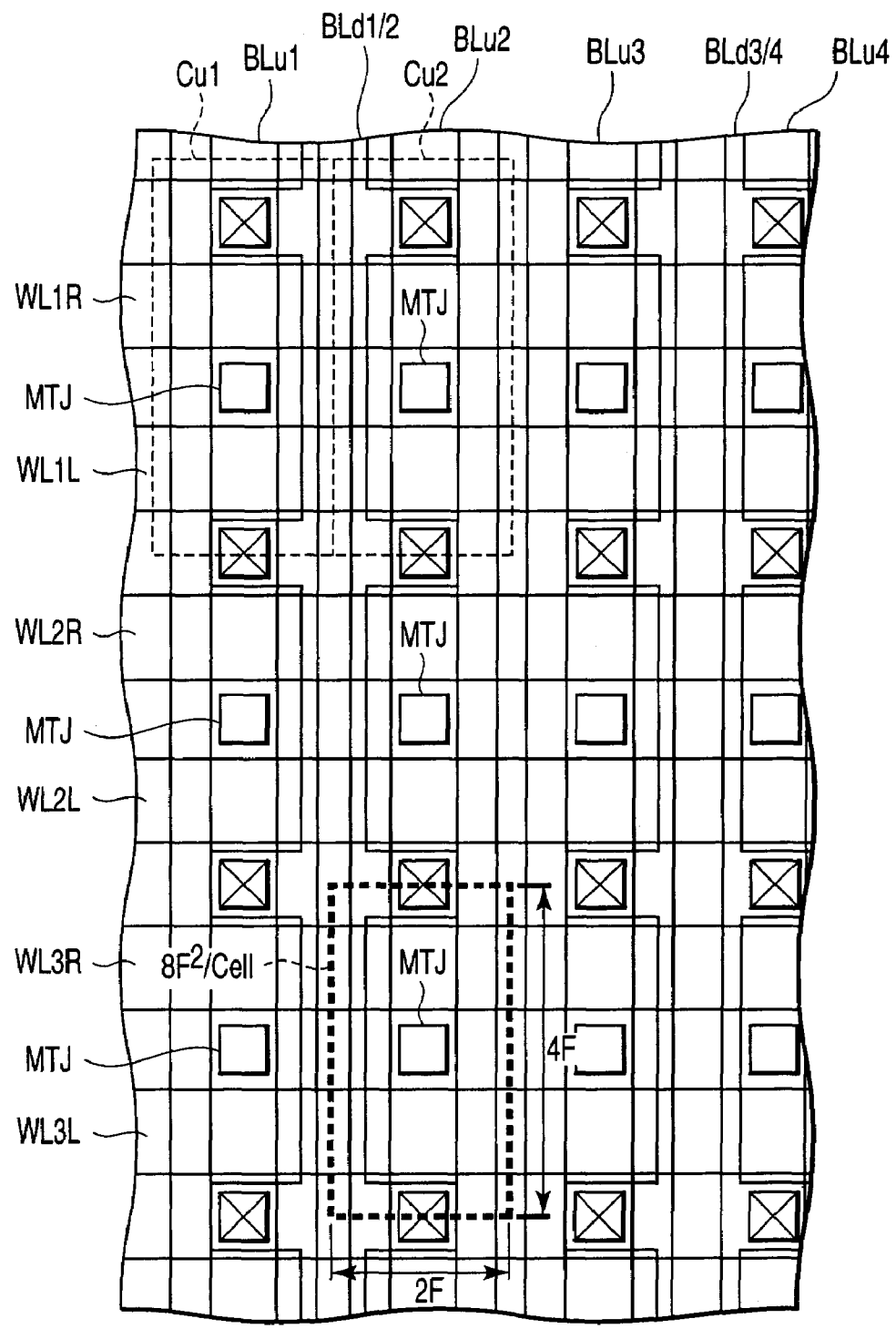
FIG. 20 is a view showing a layout of the memory cell array of FIG. 19.

FIG. 20 shows a layout of the memory cell array of FIG. 19.

The bit line BLuj and the bit line BLdj'/j'+1 are formed on different layers.

The bit lines BLuj extend in a y direction and are arranged in an x direction side by side with a fixed pitch. Each half of the pitch (half pitch) of the bit lines BLuj is set to the limit (minimum processing size) of resolution of, for instance, photolithography.

Similarly, the bit lines BLdj'/j'+1 also extend in a y direction and are arranged in an x direction side by side with a fixed pitch. However, the pitch of the bit line BLdj'/j'+1 is twice the pitch of the bit line BLdj in the comparative example of FIG. 2, because the bit line BLdj'/j'+1 is shared by two columns adjacent to each other.

Therefore, for instance, as shown in FIG. 20, a space is secured between the bit line BLd1/2 and the bit line BLd3/4, and the manufacturing process is facilitated.

Note that an area of one cell unit (memory cell) of the double gate structure can be represented by $8F^2$/cell when using F (feature size). This "F" is half (half pitch) of the pitch of the word line/bit line, and this half pitch is set to the minimum processing size.

Figure 21:
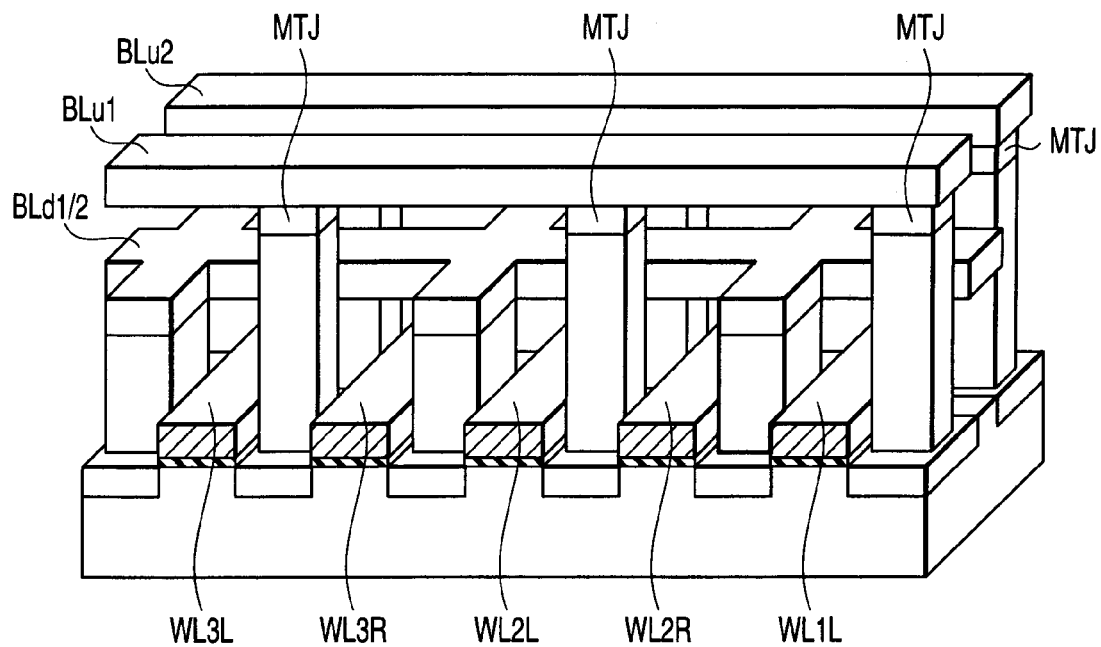
FIG. 21 is a view showing a structure in the case where the memory cell array of FIG. 20 is made three dimensional.

FIG. 21 shows the memory cell array of FIG. 20 which is made three-dimensional.

In the memory cell array of the double gate structure, since it is possible to supply the spin injection current to one magnetoresistive element MTJ using two N-channel MOSFETs, there is an advantage that, at the time of the write, it is possible to increase the current density of the spin injection current supplied to the magnetoresistive element.

(4) Fourth Embodiment

A fourth embodiment relates to a word line layout.

In the layout of the memory cell array of the single gate structure of the first and second embodiments, as shown in the layout of FIGS. 10 and 15, two MOSFETs are arranged in one element area, and the both share one of the diffusion layers (source/drain). In this case, a space is formed on an element isolation insulating layer (STI) between the element areas adjacent in the y direction.

Figure 23:
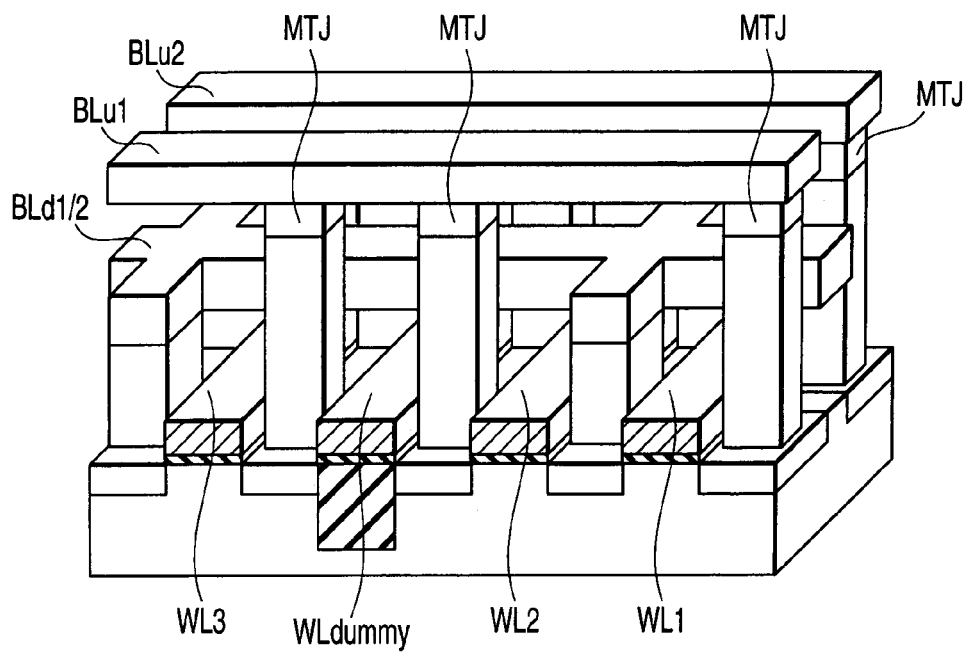
FIG. 23 is a view showing a structure in the case where the memory cell array of FIG. 22 is made three dimensional.
Figure 22:
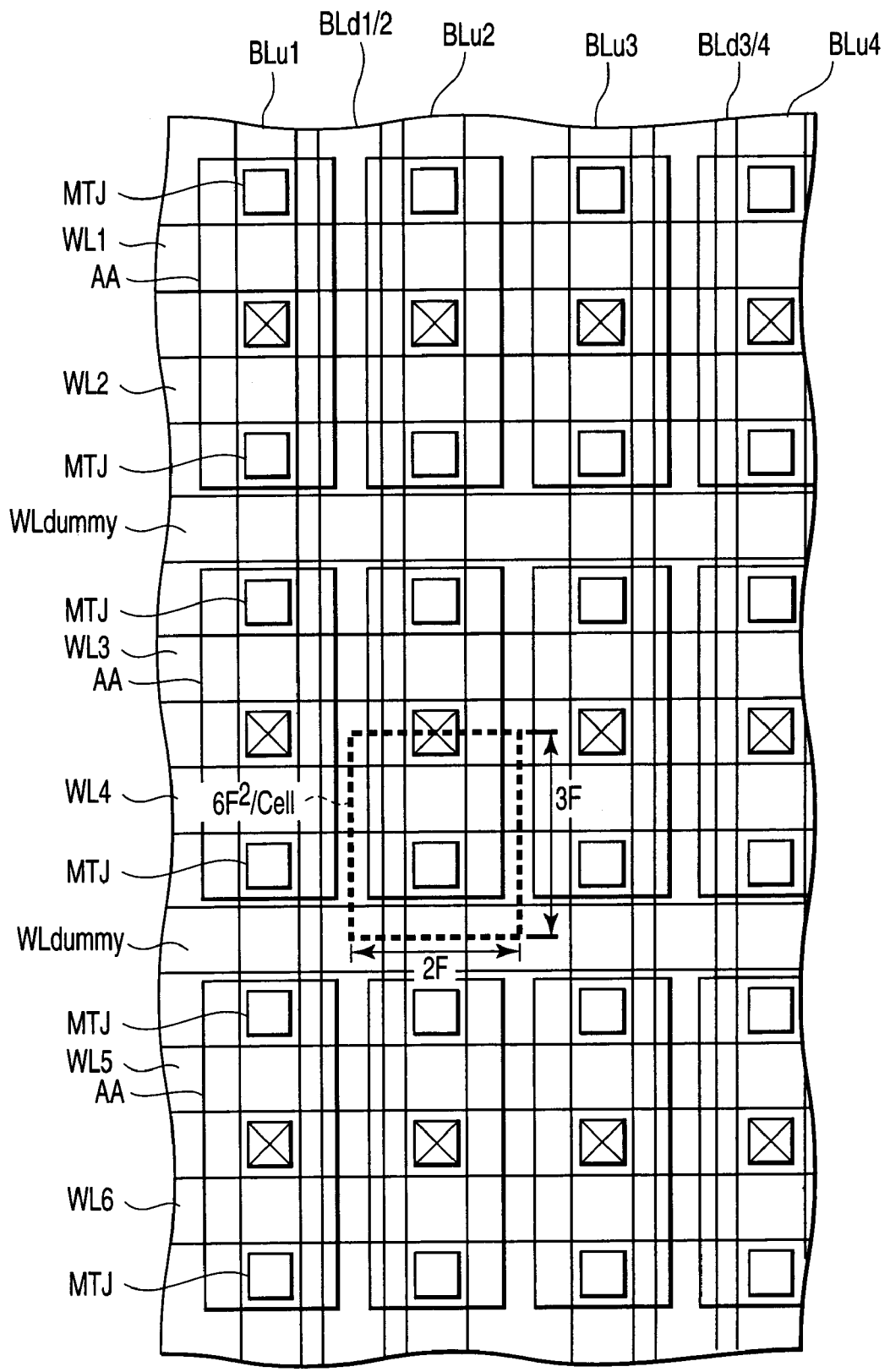
FIG. 22 is a view showing a layout of a memory cell array as a fourth embodiment.

Accordingly, as shown in FIGS. 22 and 23, a dummy word line WL dummy is arranged on the element isolation insulating layer between the element areas AA adjacent to each other in the y direction.

The dummy word line WL dummy is not connected to the row decoder and the cell unit (memory cell), and thus does not relate to the operation thereof directly. The dummy word line WL dummy is provided in order to equalize a parasitic capacitance of all the word lines WL1, WL2, WL3, WL4, WL5, WL6, . . . , and to stabilize the operation.

Further, by making the line & space of the word line regular, its processing is facilitated. Furthermore, since a depression caused by the space is not formed, this contributes to flattening an inter layer insulating layer on the word line.

An area of one cell unit (memory cell) of the single gate structure can be represented by $6F^2$/cell when using F (feature size). That is, it is possible to realize a cell area smaller than the cell unit of the above described double gate structure.

(5) Fifth Embodiment

A fifth embodiment relates to a position of a write current source/sink.

Both of two write current source/sinks of the first to third embodiments are arranged at one end of the memory cell array in the column direction (y direction).

On the contrary, in the fifth embodiment, each of the write current source/sinks is arranged one by one at both ends of the memory cell array in the column direction (y direction). In this case, since it is possible to arrange the write current source/sink and the column switch while distributed to both ends of the memory cell array, there is obtained an effect that the layout of the whole memory chip becomes simpler.

A. Circuit

FIG. 24 shows a principal part of the magnetic random access memory.

The memory cell array is comprised a plurality of cell units Cu1, Cu2, . . . arranged in an array form. One cell unit is comprised the serially connected magnetoresistive element and switch element. As the switch element, in the present example, the N-channel MOSFET (field effect transistor) is used.

The word lines WL1, WL2, WL3, . . . extend in the x direction, and are connected to the respective control terminals of the switch element, that is, the respective gate terminals of the N-channel MOSFET. The row decoder 12 is connected to one end of the word lines WL1, WL2, WL3, . . . .

The row decoder 12 makes the selected one word line WLi (i=1, 2, 3, . . . ) active, that is, at the "H" level. The switch element connected to the word line WLi is turned ON.

The bit line (write/read line) BLu1 is arranged in an odd (ODD) column, for instance, the column COL1. The bit line BLu1 is connected to one end of the magnetoresistive element.

The bit line (write/read line) BLu2 is arranged in an even (EVEN) column, for instance, the column COL2. The bit line BLu2 is connected to one end of the magnetoresistive element.

Further, the odd column and the even column, for instance, the column COL1 and the column COL2 share the bit line (write/read line) BLd1/2. The bit line BLd1/2 is connected to one of two signal terminals of the switch element.

The bit line BLu1 in the column COL1 is connected to the common line 13 via the column switch Qu1. The common line 13 is called a common line because all of the bit lines in the odd column are connected in common. The write current source/sink and read current sink 14 is connected to the common line 13.

The bit line BLu2 in the column COL2 is connected to the common line 15 via the column switch Qu2. The common line 15 is called a common line because all of the bit lines in the even column are connected in common. The write current source/sink and read current sink 16 is connected to the common line 15.

Similarly, one end of the bit line BLd1/2 is connected to the common line 13 via the column switch Qd1, and the other end thereof is connected to the common line 15 via the column switch Qd2.

In the present example, the column switches Qu1, Qd1, Qu2, and Qd2 are comprised the N-channel MOSFET.

The column decoder (controller) 17A is connected to the control terminal of the column switches Qu1, Qd1, that is, the gate terminal of the N-channel MOSFET, to control ON/OFF thereof. Further, the column decoder (controller) 17B is connected to the control terminal of the column switches Qu2, Qd2, that is, the gate terminal of the N-channel MOSFET, to control ON/OFF thereof.

The read circuit 18A is connected to the common line 13, and the read circuit 18B is connected to the common line 15.

B. Operation

There will next be described operation at the time of the write/read of the semiconductor memory.

TABLE 3

|  | Qu1 | Qd1 | Qu2 | Qd2 |
|---|---|---|---|---|
| ODD | On | Off | On | On |
| EVEN | On | On | On | Off |

Firstly, in the case where write/read is performed to the cell unit Cu1, the word line WL1 is made active, that is, at the "H" level while using the row decoder 12. Further, as shown in Table 3, the column switches Qu1, Qu2 and Qd2 are turned ON, using the column decoder 17.

At this time, the bit line BLu1 is connected to the common line 13 via the column switch Qu1, and the bit lines BLu2, BLd1/2 are connected to the common line 15 via the column switches Qu2, Qd2.

Therefore, the write to the magnetoresistive element MTJ1 in the cell unit Cu1 becomes possible by causing the spin injection current (write current) with a direction in accordance with the value of the write data to flow between the write current source/sinks 14, 16.

At the time of the write to the magnetoresistive element MTJ1, the bit lines BLu2, BLd1/2 are short circuited by the common line 15, and have the same potential. Therefore, the spin injection current does not flow through the magnetoresistive element MTJ2 in the cell unit Cu2, and thus erroneous write is prevented.

Further, the read from the magnetoresistive element MTJ1 in the cell unit Cu1 becomes possible by causing the read current to flow toward the read current sink 16 from the read circuit 18A.

Also, at the time of the read from the magnetoresistive element MTJ1, the bit lines BLu2, BLd1/2 are short circuited by the common line 15, and have the same potential. Therefore, the read current does not flow through the magnetoresistive element MTJ2 in the cell unit Cu2.

Next, in the case of performing the write/read to the cell unit Cu2, the word line WL1 is made active, that is, at the "H" level while using the row decoder 12. Further, as shown in Table 3, the column switches Qu1, Qu2 and Qd1 are turned ON while using the column decoder 17.

At this time, the bit line BLu2 is connected to the common line 15 via the column switch Qu2, and the bit lines BLu1, BLd1/2 are connected to the common line 13 via the column switches Qu1, Qd1, respectively.

Therefore, the write to the magnetoresistive element MTJ2 in the cell unit Cu2 becomes possible by causing the spin injection current (write current) with a direction in accordance with the value of the write data to flow between the write current source/sinks 14, 16.

At the time of the write to the magnetoresistive element MTJ2, the bit lines BLu1, BLd1/2 are short circuited by the common line 13, and have the same potential. Therefore, the spin injection current does not flow through the magnetoresistive element MTJ1 in the cell unit Cu1, and thus erroneous write is prevented.

Further, the read from the magnetoresistive element MTJ2 in the cell unit Cu2 becomes possible by causing the read current to flow toward the read current sink 14 from the read circuit 18B.

Also, at the time of the read from the magnetoresistive element MTJ2, the bit lines BLu1, BLd1/2 are short circuited by the common line 13, and have the same potential. Therefore, the spin injection current does not flow through the magnetoresistive element MTJ1 in the cell unit Cu1.

Note that, the read current is set to a sufficiently smaller value than a value of the write current to avoid generation of erroneous write (disturbance) at the time of the read.

C. Modified Example

Figure 25:
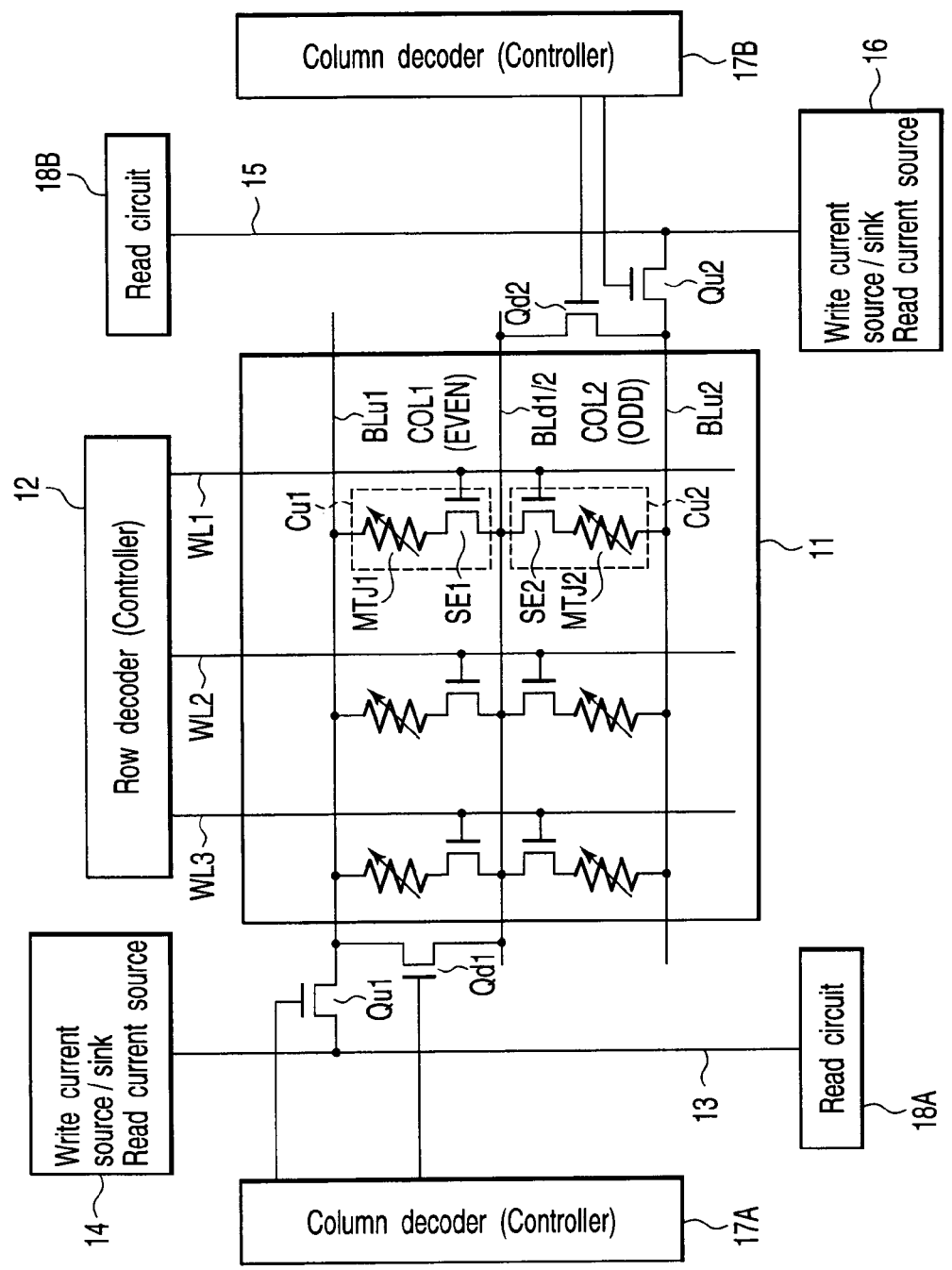
FIG. 25 is a view showing a modified example of the fifth embodiment.

FIG. 25 shows a modified example of the semiconductor memory of FIG. 24.

A characteristic of this semiconductor memory lies in that the column switch Qd1 is connected between the bit lines BLu1, BLd1/2, and the column switch Qd2 is connected between the bit lines BLu2, BLd1/2.

The other constitution is the same as that of the semiconductor memory of FIG. 24.

The operation is the same as that of the semiconductor memory of FIG. 24, and thus the description thereof will be omitted here.

D. Summary

As described above, also in the fifth embodiment, the manufacturing process can be facilitated by decreasing the number of write lines on the memory cell array.

(6) Others

The examples of the present invention are applicable to a general semiconductor memory with the resistance change element as the memory cell, for instance, PRAM (phase change random access memory), RRAM (resistance random access memory) or the like in addition to the magnetic random access memory. In this case, the magnetoresistive element described in the respective embodiments may be replaced with the element targeted by the respective memories.

Further, the examples of the present invention are applicable to the semiconductor memory which controls the write data in accordance with the direction of the voltage applied to the resistance change element, that is, in accordance with the magnitude of the potentials applied to both ends of the resistance change element, in addition to the semiconductor memory which controls the write data in accordance with the direction of the write current (for instance, spin injection current) caused to flow through the resistance change element.

Figure 27:
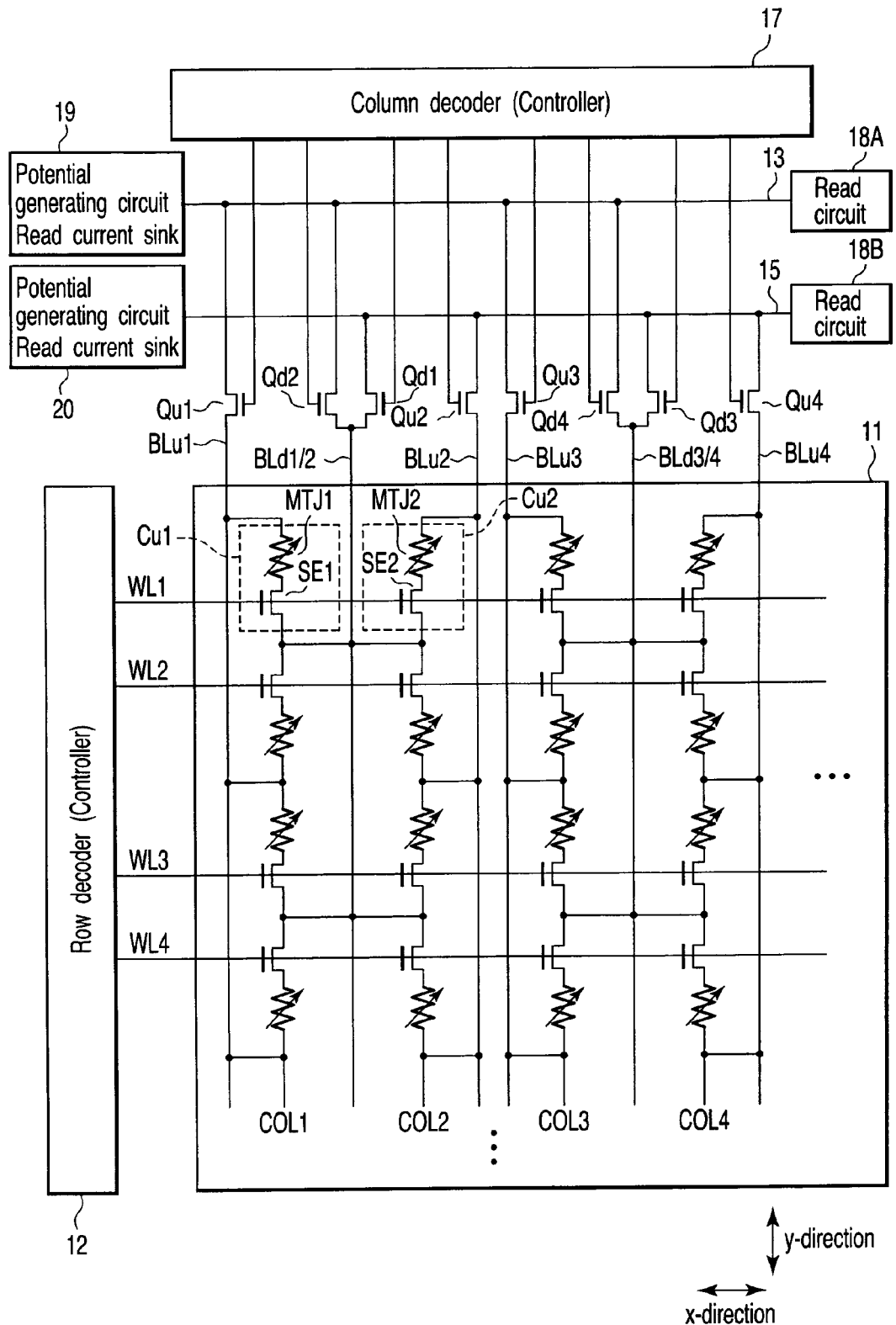
FIG. 27 is a view showing a magnetic random access memory which performs write by voltage control.

In this case, the write current source/sink described in the respective embodiments may be replaced with a write potential generating circuit. For instance, when the semiconductor memory of the first embodiment is taken as an example, the write current source/sinks 14, 16 of FIG. 5 are changed to potential generating circuits 19, 20, as shown in FIG. 27.

5. CONCLUSION

According to the examples of the present invention, it is possible to facilitate the manufacturing process by decreasing the number of write lines on the memory cell array.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory comprising:
    a word line extending in a first direction;
    first, second and third bit lines extending in a second direction crossing the first direction;
    a first cell unit comprised a first resistance change element and a first switch element connected serially between the first and second bit lines, a control terminal of the first switch element being connected to the word line;
    a second cell unit comprised a second resistance change element and a second switch element connected serially between the first and third bit lines, a control terminal of the second switch element being connected to the word line; and
    a controller which executes write to the first resistance change element under the condition that the word line is made active and potentials of the first and third bit lines are equalized, and executes write to the second resistance change element under the condition that the word line is made active and potentials of the first and second bit lines are equalized.

2. The semiconductor memory according to claim 1, further comprising:
    first and second common lines;
    a first column switch connected between the first bit line and the first common line;
    a second column switch connected between the first bit line and the second common line;
    a third column switch connected between the second bit line and the first common line; and
    a fourth column switch connected between the third bit line and the second common line.

3. The semiconductor memory according to claim 2, wherein the controller turns the second, third and fourth column switches ON at the time of write to the first resistance change element, and turns the first, third and fourth column switches ON at the time of write to the second resistance change element.

4. The semiconductor memory according to claim 2, wherein each of the first and second common lines is connected to a write current source/sink, and write data to the first and second resistance change elements is controlled by current.

5. The semiconductor memory according to claim 2, wherein each of the first and second common lines is connected to a write potential generating circuit, and write data to the first and second resistance change elements is controlled by voltage.

6. The semiconductor memory according to claim 2, further comprising:
    a first read circuit connected to the first common line; and
    a second read circuit connected to the second common line.

7. The semiconductor memory according to claim 1, further comprising:
    first and second common lines;
    a first column switch connected between the first bit line and the first common line;
    a second column switch connected between the second bit line and the second common line;
    a third column switch connected between the third bit line and the second common line;
    a fourth column switch connected between the first and second bit lines; and
    a fifth column switch connected between the first and third bit lines.

8. The semiconductor memory according to claim 7, wherein the controller turns the first, second and fifth column switches ON at the time of write to the first resistance change element, and turns the first, third and fourth column switches ON at the time of write to the second resistance change element.

9. The semiconductor memory according to claim 7, wherein each of the first and second common lines is connected to a write current source/sink, and write data to the first and second resistance change elements is controlled by current.

10. The semiconductor memory according to claim 7, wherein each of the first and second common lines is connected to a write potential generating circuit, and write data to the first and second resistance change elements is controlled by voltage.

11. The semiconductor memory according to claim 7, further comprising:
    a first read circuit connected to the first common line; and
    a second read circuit connected to the second common line.

12. The semiconductor memory according to claim 1, further comprising:
    first and second common lines;
    a first column switch connected between the second bit line and the first common line;
    a second column switch connected between the third bit line and the second common line;
    a third column switch connected between the first and second bit lines; and
    a fourth column switch connected between the first and third bit lines.

13. The semiconductor memory according to claim 12, wherein the controller turns the first, second and fourth column switches ON at the time of write to the first resistance change element, and turns the first, second and third column switches ON at the time of write to the second resistance change element.

14. The semiconductor memory according to claim 12, wherein each of the first and second common lines is connected to a write current source/sink, and write data to the first and second resistance change elements is controlled by current.

15. The semiconductor memory according to claim 12, wherein each of the first and second common lines is connected to a write potential generating circuit, and write data to the first and second resistance change elements is controlled by voltage.

16. The semiconductor memory according to claim 12, further comprising:
 a first read circuit connected to the first common line; and
 a second read circuit connected to the second common line.

17. The semiconductor memory according to claim 1, further comprising:
 first and second common lines;
 a first column switch connected between one end of the first bit line and the first common line;
 a second column switch connected between the other end of the first bit line and the second common line; and
 a third column switch connected between the second bit line and the first common line;
 a fourth column switch connected between the third bit line and the second common line.

18. The semiconductor memory according to claim 17, wherein the controller turns the second, third and forth column switches ON at the time of write to the first resistance change element, and turns the first, third and fourth column switches ON at the time of write to the second resistance change element.

19. The semiconductor memory according to claim 1, wherein the first and second cell units have a double gate structure.

20. The semiconductor memory according to claim 1, further comprising
 a dummy word line extending in the first direction and arranged adjacent to the word line.

* * * * *